US008975115B2

(12) United States Patent
Endo et al.

(10) Patent No.: US 8,975,115 B2
(45) Date of Patent: *Mar. 10, 2015

(54) SEMICONDUCTOR DEVICE AND METHOD FOR MANUFACTURING THE SAME

(71) Applicant: Semiconductor Energy Laboratory Co., Ltd., Atsugi (JP)

(72) Inventors: Yuta Endo, Kanagawa (JP); Kosei Noda, Kanagawa (JP); Toshinari Sasaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/148,906

(22) Filed: Jan. 7, 2014

(65) Prior Publication Data

US 2014/0120660 A1    May 1, 2014

Related U.S. Application Data

(60) Continuation of application No. 13/949,329, filed on Jul. 24, 2013, now Pat. No. 8,637,348, which is a division of application No. 13/185,779, filed on Jul. 19, 2011, now Pat. No. 8,519,387.

(30) Foreign Application Priority Data

Jul. 26, 2010    (JP) .................................. 2010-167383

(51) Int. Cl.
*H01L 21/00*    (2006.01)
*H01L 29/786*    (2006.01)
(Continued)

(52) U.S. Cl.
CPC ...... *H01L 29/66969* (2013.01); *H01L 29/7869* (2013.01); *H01L 21/02164* (2013.01);
(Continued)

(58) Field of Classification Search
CPC ................................................. H01L 29/7869

USPC ..................... 438/104, 151; 257/43, E29.296
See application file for complete search history.

(56) References Cited

U.S. PATENT DOCUMENTS 5,731,856 A    3/1998    Kim
5,744,864 A    4/1998    Cillessen
(Continued)

FOREIGN PATENT DOCUMENTS

EP    1 737 044 A1    12/2006
EP    2 226 847 A2    9/2010
(Continued)

OTHER PUBLICATIONS

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.
(Continued)

*Primary Examiner* — Mark Prenty
(74) *Attorney, Agent, or Firm* — Fish & Richardson P.C.

(57) ABSTRACT

An insulating layer which releases a large amount of oxygen is used as an insulating layer in contact with a channel region of an oxide semiconductor layer, and an insulating layer which releases a small amount of oxygen is used as an insulating layer in contact with a source region and a drain region of the oxide semiconductor layer. By releasing oxygen from the insulating layer which releases a large amount of oxygen, oxygen deficiency in the channel region and an interface state density between the insulating layer and the channel region can be reduced, so that a highly reliable semiconductor device having small variation in electrical characteristics can be manufactured. The source region and the drain region are provided in contact with the insulating layer which releases a small amount of oxygen, thereby suppressing the increase of the resistance of the source region and the drain region.

23 Claims, 9 Drawing Sheets

(51) Int. Cl.
*H01L 29/66* (2006.01)
*H01L 21/02* (2006.01)

(52) U.S. Cl.
CPC .... *H01L29/78618* (2013.01); *H01L 21/02565* (2013.01); *H01L 21/02367* (2013.01); *H01L 29/78603* (2013.01); *H01L 29/66742* (2013.01)
USPC .......................................... 438/104; 438/151

(56) References Cited

U.S. PATENT DOCUMENTS

| | | |
|---|---|---|
| 6,294,274 B1 | 9/2001 | Kawazoe |
| 6,563,174 B2 | 5/2003 | Kawasaki |
| 6,727,522 B1 | 4/2004 | Kawasaki |
| 7,049,190 B2 | 5/2006 | Takeda |
| 7,061,014 B2 | 6/2006 | Hosono |
| 7,064,346 B2 | 6/2006 | Kawasaki |
| 7,105,868 B2 | 9/2006 | Nause |
| 7,211,825 B2 | 5/2007 | Shih |
| 7,282,782 B2 | 10/2007 | Hoffman |
| 7,297,977 B2 | 11/2007 | Hoffman |
| 7,323,356 B2 | 1/2008 | Hosono |
| 7,385,224 B2 | 6/2008 | Ishii |
| 7,402,506 B2 | 7/2008 | Levy |
| 7,411,209 B2 | 8/2008 | Endo |
| 7,453,065 B2 | 11/2008 | Saito |
| 7,453,087 B2 | 11/2008 | Iwasaki |
| 7,462,862 B2 | 12/2008 | Hoffman |
| 7,468,304 B2 | 12/2008 | Kaji |
| 7,501,293 B2 | 3/2009 | Ito |
| 7,674,650 B2 | 3/2010 | Akimoto |
| 7,732,819 B2 | 6/2010 | Akimoto |
| 7,791,072 B2 | 9/2010 | Kumomi |
| 8,183,099 B2 | 5/2012 | Sakata |
| 8,519,387 B2 | 8/2013 | Endo |
| 8,637,348 B2 * | 1/2014 | Endo et al. ................... 438/104 |
| 2001/0046027 A1 | 11/2001 | Tai |
| 2002/0056838 A1 | 5/2002 | Ogawa |
| 2002/0132454 A1 | 9/2002 | Ohtsu |
| 2003/0189401 A1 | 10/2003 | Kido |
| 2003/0218222 A1 | 11/2003 | Wager |
| 2004/0038446 A1 | 2/2004 | Takeda |
| 2004/0127038 A1 | 7/2004 | Carcia |
| 2005/0017302 A1 | 1/2005 | Hoffman |
| 2005/0199959 A1 | 9/2005 | Chiang |
| 2006/0035452 A1 | 2/2006 | Carcia |
| 2006/0043377 A1 | 3/2006 | Hoffman |
| 2006/0091793 A1 | 5/2006 | Baude |
| 2006/0108529 A1 | 5/2006 | Saito |
| 2006/0108636 A1 | 5/2006 | Sano |
| 2006/0110867 A1 | 5/2006 | Yabuta |
| 2006/0113536 A1 | 6/2006 | Kumomi |
| 2006/0113539 A1 | 6/2006 | Sano |
| 2006/0113549 A1 | 6/2006 | Den |
| 2006/0113565 A1 | 6/2006 | Abe |
| 2006/0169973 A1 | 8/2006 | Isa |
| 2006/0170111 A1 | 8/2006 | Isa |
| 2006/0197092 A1 | 9/2006 | Hoffman |
| 2006/0208977 A1 | 9/2006 | Kimura |
| 2006/0228974 A1 | 10/2006 | Thelss |
| 2006/0231882 A1 | 10/2006 | Kim |
| 2006/0238135 A1 | 10/2006 | Kimura |
| 2006/0244107 A1 | 11/2006 | Sugihara |
| 2006/0284171 A1 | 12/2006 | Levy |
| 2006/0284172 A1 | 12/2006 | Ishii |
| 2006/0292777 A1 | 12/2006 | Dunbar |
| 2007/0024187 A1 | 2/2007 | Shin |
| 2007/0046191 A1 | 3/2007 | Saito |
| 2007/0052025 A1 | 3/2007 | Yabuta |
| 2007/0054507 A1 | 3/2007 | Kaji |
| 2007/0090365 A1 | 4/2007 | Hayashi |
| 2007/0108446 A1 | 5/2007 | Akimoto |
| 2007/0152217 A1 | 7/2007 | Lai |
| 2007/0172591 A1 | 7/2007 | Seo |
| 2007/0187678 A1 | 8/2007 | Hirao |
| 2007/0187760 A1 | 8/2007 | Furuta |
| 2007/0194379 A1 | 8/2007 | Hosono |
| 2007/0252928 A1 | 11/2007 | Ito |
| 2007/0272922 A1 | 11/2007 | Kim |
| 2007/0287296 A1 | 12/2007 | Chang |
| 2008/0006877 A1 | 1/2008 | Mardilovich |
| 2008/0038882 A1 | 2/2008 | Takechi |
| 2008/0038929 A1 | 2/2008 | Chang |
| 2008/0050595 A1 | 2/2008 | Nakagawara |
| 2008/0073653 A1 | 3/2008 | Iwasaki |
| 2008/0083950 A1 | 4/2008 | Pan |
| 2008/0106191 A1 | 5/2008 | Kawase |
| 2008/0128689 A1 | 6/2008 | Lee |
| 2008/0129195 A1 | 6/2008 | Ishizaki |
| 2008/0166834 A1 | 7/2008 | Kim |
| 2008/0182358 A1 | 7/2008 | Cowdery-Corvan |
| 2008/0224133 A1 | 9/2008 | Park |
| 2008/0254569 A1 | 10/2008 | Hoffman |
| 2008/0258139 A1 | 10/2008 | Ito |
| 2008/0258140 A1 | 10/2008 | Lee |
| 2008/0258141 A1 | 10/2008 | Park |
| 2008/0258143 A1 | 10/2008 | Kim |
| 2008/0296568 A1 | 12/2008 | Ryu |
| 2009/0068773 A1 | 3/2009 | Lai |
| 2009/0073325 A1 | 3/2009 | Kuwabara |
| 2009/0114910 A1 | 5/2009 | Chang |
| 2009/0134399 A1 | 5/2009 | Sakakura |
| 2009/0152506 A1 | 6/2009 | Umeda |
| 2009/0152541 A1 | 6/2009 | Maekawa |
| 2009/0278122 A1 | 11/2009 | Hosono |
| 2009/0280600 A1 | 11/2009 | Hosono |
| 2010/0065844 A1 | 3/2010 | Tokunaga |
| 2010/0092800 A1 | 4/2010 | Itagaki |
| 2010/0109002 A1 | 5/2010 | Itagaki |
| 2010/0295041 A1 | 11/2010 | Kumomi |
| 2011/0068336 A1 | 3/2011 | Yamazaki |
| 2011/0101335 A1 | 5/2011 | Yamazaki |
| 2012/0018727 A1 | 1/2012 | Endo |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 11-505377 A5 | 8/2004 |
| JP | 2004-273614 A | 9/2004 |
| JP | 2004-273732 A | 9/2004 |
| JP | 2006-165528 A | 6/2006 |
| WO | WO 2004/114391 A1 | 12/2004 |

OTHER PUBLICATIONS

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs with a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD

(56) References Cited

OTHER PUBLICATIONS

'09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosphical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-film Transistors by Ar Plasma Treatment," Appl. Phys. Lett (Applied Physics Letters), Jun. 26, 2007, vol. 90, No. 26, pp. 262106-1-26206-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Jae Chul Park et al.; "High performance amorphous oxide thin film transistors with self-aligned top-gate structure"; IEDM '09; 2009; pp. 191-194.

Sangwook Kim et al.; "Source/Drain Formation of Self-Aligned Top-Gate Amorphous GaInZnO Thin-Film Transistors by NH3 Plasma Treatment"; IEEE Electron Device Letters; Apr. 2009; pp. 374-376; vol. 30, No. 4.

Ryo Hayashi et al.; "Improved Amorphous In—Ga—Zn—O TFTs"; SID Digest '08 : SID International Symposium Digest of Technical Papers; 2008; pp. 621-624; vol. 39.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "Improved Amorphous In—Ga—Zn—O TFTs," SID Digest '08 : SID International Symposium Digest of Technical Papers, 2008, pp. 621-624, vol. 39.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs

(56) References Cited

OTHER PUBLICATIONS

Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kim, S et al.; "Source/Drain Formation of Self-Aligned Top-Gate Amorphous GaInZnO Thin-Film Transistors by NH3 Plasma Treatment," IEEE Electron Device Letters, Apr. 2009, pp. 374-376, vol. 30, No. 4.

Kimizuka, N. et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using Igzo Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Morosawa.N et al., "35.3: Distinguished Paper: A Novel Self-Aligned Top-Gate Oxide TFT for AM-OLED Display", SID Digest '11: SID International Symposium Digest of Technical Papers, May 17, 2011, pp. 479-482.

* cited by examiner

SEMICONDUCTOR DEVICE AND METHOD FOR MANUFACTURING THE SAME

CROSS-REFERENCE TO RELATED APPLICATIONS

This application is a continuation of U.S. application Ser. No. 13/949,329, filed Jul. 24, 2013, now allowed, which is a divisional of U.S. application Ser. No. 13/185,779, filed Jul. 19, 2011, now U.S. Pat. No. 8,519,387, which claims the benefit of a foreign priority application filed in Japan as Serial No. 2010-167383 on Jul. 26, 2010, all of which are incorporated by reference.

BACKGROUND OF THE INVENTION

1. Field of the Invention

The present invention relates to a semiconductor device and a method for manufacturing the semiconductor device.

In this specification, a semiconductor device means a general device which can function by utilizing semiconductor characteristics, and an electro-optic device, a semiconductor circuit, and an electronic device are all semiconductor devices.

2. Description of the Related Art

A technique by which transistors are formed using semiconductor thin films over a substrate having an insulating surface has been attracting attention. Such transistors are applied to a wide range of electronic devices such as integrated circuits (ICs) or image display devices (display devices). A silicon-based semiconductor material is widely known as a material for a semiconductor thin film applicable to a transistor. As another material, an oxide semiconductor has been attracting attention.

For example, a transistor whose active layer includes an amorphous oxide containing indium (In), gallium (Ga), and zinc (Zn) and having an electron carrier concentration of less than $10^{18}/cm^3$ is disclosed (see Patent Document 1).

A transistor including an oxide semiconductor is known to have a problem of low reliability because of high possibility of fluctuation in electric characteristics, although the transistor including an oxide semiconductor can operate at higher speed than a transistor including amorphous silicon and can be manufactured more easily than a transistor including polycrystalline silicon. For example, the threshold voltage of the transistor fluctuates after a bias-temperature stress test (BT test). Note that in this specification, a threshold voltage refers to a gate voltage which is needed to turn on a transistor. A gate voltage refers to a potential difference between a source electrode and a gate electrode when the potential of the source electrode is used as a reference potential.

REFERENCE

Patent Document

[Patent Document 1] Japanese Published Patent Application No. 2006-165528

SUMMARY OF THE INVENTION

Fluctuation in the threshold voltage due to a BT test of the transistor including an oxide semiconductor remarkably reduces the reliability of the transistor including an oxide semiconductor. An object of one embodiment of the present invention is to improve the reliability of a semiconductor device including an oxide semiconductor.

One embodiment of the present invention is a semiconductor device or a method for manufacturing the semiconductor device, which is based on a technical idea that an insulating layer from which oxygen is released by heating is used as an insulating layer in contact with a channel region of an oxide semiconductor layer, and an insulating layer which releases a smaller amount of oxygen than the insulating layer in contact with the channel region is used as an insulating layer in contact with a source region and a drain region of the oxide semiconductor layer.

One embodiment of the present invention is a semiconductor device or a method for manufacturing the semiconductor device. The semiconductor device includes an insulating layer including a first region and a second region; and an oxide semiconductor layer which is in contact with the first region and the second region and includes a channel region, a source region, and a drain region. The channel region of the oxide semiconductor layer is in contact with the first region. The source region and the drain region of the oxide semiconductor layer are in contact with the second region. The first region is an insulating layer from which oxygen is released by heating. The second region is an insulating layer which releases a smaller amount of oxygen than the first region.

To release oxygen by heating means that the released amount of oxygen which is converted to oxygen atoms is greater than or equal to $1 \times 10^{18}$ atoms/cm$^3$, preferably greater than or equal to $3 \times 10^{20}$ atoms/cm$^3$ in thermal desorption spectroscopy (TDS).

Supply of oxygen to the channel region from the first region that is the insulating layer in contact with the channel region can reduce an interface state density between the channel region and the first region. As a result, it is possible to sufficiently suppress trapping of charge or the like which can be generated due to the operation of a semiconductor device, or the like, at an interface between the first region and the channel region.

Further, charge is caused due to oxygen deficiency in the channel region in some cases. In general, part of oxygen deficiency in a channel region serves as a donor and generates electrons that are carriers. As a result, the threshold voltage of the transistor shifts in the negative direction. A sufficient amount of oxygen is released to the channel region from the first region that is the insulating layer in contact with the channel region, whereby oxygen deficiency in the channel region, which causes the shift of the threshold voltage in the negative direction, can be compensated.

In other words, when oxygen deficiency is caused in the channel region, it is difficult to suppress charge trapping at the interface between the channel region and the first region that is an insulating layer in contact with the channel region. However, by providing an insulating layer from which oxygen is released by heating as the first region, the interface state density between the channel region and the first region and the oxygen deficiency in the channel region can be reduced, and influence by the charge trapping at the interface between the channel region and the first region can be reduced.

In addition, the source region and the drain region are provided in contact with the second region which releases a smaller amount of oxygen than the first region so that oxygen is not supplied to the source region and the drain region. This structure is employed, considering that the part of oxygen deficiency in the oxide semiconductor layer generates electrons that are carriers. In other words, this is based on a technical idea that is to suppress the increase of the resistance of the source region and the drain region which is caused by the reduction of oxygen deficiency by supply of oxygen. For example, an insulating layer which releases oxygen of less than $1\times10^{18}$ atoms/cm$^3$ in TDS analysis can be used as the second region in contact with the source region and the drain region.

Thus, the effect of one embodiment of the present invention is attributed to the insulating layer from which oxygen is released by heating and the insulating layer which releases a smaller amount of oxygen than the insulating layer.

Owing to an effect of suppressing the charge trapping at the interface of the channel region of the oxide semiconductor layer and suppressing the increase of the resistance of the source region and the drain region, it is possible to suppress a malfunction such as the reduction of an on-state current of the transistor, to which the reduction of current flowing through the source region and the drain region in comparison with the channel region which is caused by the increase of the resistance of the source region and the drain region is attributed. In addition, a malfunction such as the increase of an off-state current of the transistor including the oxide semiconductor and the shift of the threshold voltage can be suppressed. Further, the reliability of the semiconductor device can be improved.

Note that the insulating layer from which oxygen is released by heating preferably has an enough thickness with respect to the oxide semiconductor layer. This is because when the thickness of the insulating layer from which oxygen is released by heating is smaller than that of the oxide semiconductor layer, oxygen is not sufficiently supplied to the oxide semiconductor layer in some cases.

One embodiment of the present invention is a semiconductor device or a method for manufacturing the semiconductor device. The semiconductor device includes an insulating layer including a first region and a second region; an oxide semiconductor layer which is provided in contact with the first region and the second region and includes a channel region, a source region, and a drain region; a gate insulating layer in contact with the oxide semiconductor layer; and a gate electrode in contact with the gate insulating layer. The channel region of the oxide semiconductor layer is provided in contact with the first region. The source region and the drain region of the oxide semiconductor layer are provided in contact with the second region. The first region is an insulating layer from which oxygen is released by heating. The second region is an insulating layer which releases a smaller amount of oxygen than the first region. Note that the first region may be formed using a material having constituent elements which are the same or different from those of the material of the second region or a material whose two or more constituent elements are the same as those of the material of the second region.

In the above structure, the insulating layer from which oxygen is released by heating may be oxygen-excess silicon oxide (SiO$_X$(X>2)). In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by Rutherford backscattering spectrometry.

In the above structure, as the insulating layer from which oxygen is released by heating, silicon oxide, silicon oxynitride, or aluminum oxide may be used. In addition, as the insulating layer which releases a smaller amount of oxygen than the first region, silicon oxide, silicon nitride, silicon nitride oxide, silicon oxynitride, aluminum oxide, aluminum nitride, or aluminum oxynitride may be used. The first region may be formed using a material having different constituent elements from the material of the second region. For example, silicon oxide is used for the insulating layer from which oxygen is released by heating, whereas silicon nitride, silicon nitride oxide, silicon oxynitride, aluminum oxide, aluminum nitride, or aluminum oxynitride may be used for the insulating layer which releases a smaller amount of oxygen than the first region. For example, in the case where silicon oxide is used for the first region, aluminum oxide, whose oxygen diffusion coefficient is less than that of silicon oxide at an arbitrary temperature, is preferably used for the second region. The second region whose oxygen diffusion coefficient is less than that of the first region is provided, whereby the amount of oxygen released from the first region and diffused into the second region can be reduced.

In this specification, silicon oxynitride refers to a substance that contains more oxygen than nitrogen. For example, silicon oxynitride includes oxygen, nitrogen, silicon, and hydrogen at concentrations of greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0 at. % and less than or equal to 10 at. %, respectively. In addition, silicon nitride oxide refers to a substance that contains more nitrogen than oxygen. For example, silicon nitride oxide contains oxygen, nitrogen, silicon, and hydrogen at concentrations of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 25 at. %, respectively. Note that percentages of the aforementioned elements are obtained in the cases where measurement is performed using Rutherford backscattering spectrometry (RBS) or hydrogen forward scattering (HFS). In addition, the total of the percentages of the constituent elements does not exceed 100 at. %. Aluminum oxynitride refers to a substance that contains more oxygen than nitrogen.

In the above structure, a surface of the first region and a surface of the second region are preferably aligned with each other. In other words, the first region preferably has the same thickness as the second region. In addition, at the vicinity of the boundary between the first region and the second region, the surface of the first region and the surface of the second region are preferably formed continuously.

Alternatively, it is possible to omit the second region in the above structure. In that case, a first insulating layer may be selectively provided over a substrate, and the first insulating layer may be used as the insulating layer from which oxygen is released by heating. Alternatively, a second insulating layer may be provided over the substrate, the first insulating may be selectively provided over the second insulating layer, and the first insulating layer may be used as the insulating layer from which oxygen is released by heating.

That is, one embodiment of the present invention is a semiconductor device or a method for manufacturing the semiconductor device. The semiconductor device includes a first insulating layer selectively provided over a substrate or a second insulating layer provided over the substrate; an oxide semiconductor layer which is provided in contact with the first insulating, and the substrate or the second insulating layer and includes a channel region, a source region, and a drain region; a gate insulating layer provided in contact with the oxide semiconductor layer; and a gate electrode provided in contact with the gate insulating layer. The channel region of the oxide semiconductor layer is provided in contact with the first insulating layer. The source region and the drain region of the oxide semiconductor layer are provided in contact with the substrate or the second insulating layer. The first insulating layer is an insulating layer from which oxygen is released by heating.

In the above structure, the insulating layer from which oxygen is released by heating may be oxygen-excess silicon oxide ($SiO_X$(X>2)). In the oxygen-excess silicon oxide ($SiO_X$(X>2)), the number of oxygen atoms per unit volume is more than twice the number of silicon atoms per unit volume. The number of silicon atoms and the number of oxygen atoms per unit volume are measured by Rutherford backscattering spectrometry.

In the above structure, as the insulating layer from which oxygen is released by heating, silicon oxide, silicon oxynitride, or aluminum oxide may be used.

In the above structure, the amount of oxygen released from the substrate or the second insulating layer is preferably smaller than that from the first insulating layer.

In the above structure, as the second insulating layer, silicon oxide, silicon nitride, silicon nitride oxide, silicon oxynitride, aluminum oxide, aluminum nitride, or aluminum oxynitride may be used.

In the above structure, an insulating layer from which oxygen is released by heating is preferably used as the gate insulating layer. Alternatively, silicon oxide in which the number of oxygen atoms is more than twice the number of silicon atoms per unit volume is preferably used as the gate insulating layer.

In the above structure, an interlayer insulating layer may be further provided over the gate electrode, and a wiring which is in contact with the oxide semiconductor layer through an opening portion provided in the interlayer insulating layer may be further provided over the interlayer insulating layer.

In the above structure, the source region and the drain region are obtained by reducing the resistance of the oxide semiconductor layer. In other words, the source region and the drain region are formed by reducing the resistance of part of the oxide semiconductor layer. At the same time, the channel region is formed in the oxide semiconductor layer.

In the above structure, the insulating layer from which oxygen is released by heating is preferably formed by a sputtering method. Alternatively, the insulating layer from which oxygen is released by heating is preferably formed by a sputtering method using oxygen or a mixed gas of oxygen and argon.

In the above structure, the oxide semiconductor layer is preferably formed by a sputtering method.

In the above structure, after the oxide semiconductor layer is formed, heat treatment is preferably performed at a temperature higher than or equal to 100° C. and lower than or equal to 650° C.

In the above structure, the source region and the drain region may be formed by reducing the resistance of part of the oxide semiconductor layer with the use of the gate electrode as a mask. In that case, the channel region is formed in part of the oxide semiconductor layer which is covered with the gate electrode.

In the above structure, the channel length L of the transistor can be greater than or equal to 10 nm and less than or equal to 10 μm, for example, 0.1 μm to 0.5 μm. Needless to say, the channel length L may be greater than or equal to 10 μm. The channel width W can be greater than or equal to 10 μm.

According to one embodiment of the present invention, an insulating layer from which oxygen is released by heating is provided as an insulating layer in contact with a channel region of an oxide semiconductor layer, and an insulating layer which releases a smaller amount of oxygen than the insulating layer in contact with the channel region is provided as an insulating layer in contact with a source region and a drain region of the oxide semiconductor layer. As a result, a transistor having a small off-state current, small variation in the threshold voltage, a large on-state current, and stable electrical characteristics can be provided.

According to one embodiment of the present invention, a semiconductor device including a highly reliable transistor having favorable electric characteristics is provided.

DETAILED DESCRIPTION OF THE INVENTION

Figure 1A:
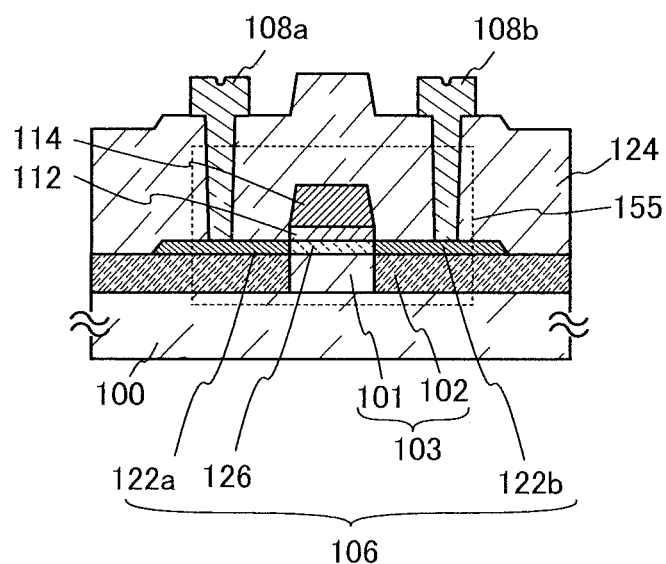
FIGS. 1A and 1B are cross-sectional views each illustrating one embodiment of a semiconductor device.

Hereinafter, embodiments of the present invention will be described in detail with reference to the accompanying drawings. However, the present invention is not limited to the description below and it is easily understood by those skilled in the art that the mode and details can be changed variously. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, an embodiment of a semiconductor device and a method for manufacturing the semiconductor device will be described with reference to FIGS. 1A and 1B, FIGS. 2A to 2D, FIGS. 3A to 3D, FIGS. 4A to 4D, and FIGS. 5A and 5B.

Figure 1B:
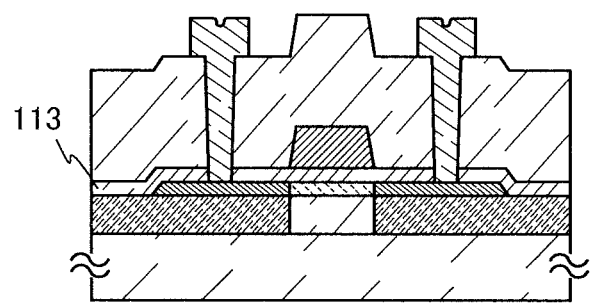

FIGS. 1A and 1B each illustrate a cross-sectional view of a coplanar transistor 155, which is one mode of a top-gate transistor, as an example of a semiconductor device according to an embodiment of the present invention.

The transistor 155 illustrated in FIG. 1A includes an insulating layer 103, an oxide semiconductor layer 106, a gate insulating layer 112, and a gate electrode 114, which are over a substrate 100. The insulating layer 103 includes a first region 101 and a second region 102. The oxide semiconductor layer 106 of the transistor 155 includes a channel region 126, a source region 122a, and a drain region 122b. The channel region 126, the source region 122a, and the drain region 122b are included in the same layer.

The oxide semiconductor layer 106 is provided in contact with the first region 101 and the second region 102. The channel region 126 of the oxide semiconductor layer 106 is provided in contact with the first region 101. The source region 122a and the drain region 122b of the oxide semiconductor layer 106 are provided in contact with the second region 102. The gate insulating layer 112 is provided in contact with the oxide semiconductor layer 106. The gate electrode 114 is provided in contact with the gate insulating layer 112. An interlayer insulating layer 124 is provided over the gate electrode 114. The source region 122a and the drain region 122b are electrically connected to a wiring 108a and a wiring 108b, respectively, through the interlayer insulating layer 124. The wiring 108a and the wiring 108b function as a source electrode and a drain electrode. Note that the width of the gate insulating layer 112 is the same as that of the gate electrode 114 in FIG. 1A; however, an embodiment of the present invention is not limited thereto. Instead of the gate insulating layer 112, a gate insulating layer 113 may be provided over the insulating layer 103 and the oxide semiconductor layer 106 as illustrated in FIG. 1B. Note that the gate insulating layer 113 may be formed using the same method and the same material as those of the gate insulating layer 112. The gate insulating layer 113 can be substituted for the gate insulating layer 112 in this specification as appropriate.

As the material of the first region 101, silicon oxide, silicon oxynitride, aluminum oxide, a mixed material of any of them, or the like may be used. Oxygen is released from the first region 101 by heating. To release oxygen by heating means that the released amount of oxygen which is converted to oxygen atoms is greater than or equal to $1\times10^{18}$ atoms/cm$^3$, preferably greater than or equal to $3\times10^{20}$ atoms/cm$^3$ in thermal desorption spectroscopy (TDS). Alternatively, as the material of the first region 101, oxygen-excess silicon oxide ($SiO_X$ ($X>2$)) may be used. In the oxygen-excess silicon oxide ($SiO_X$ ($X>2$)), the number of oxygen atoms per unit volume is more than twice the number of silicon atoms per unit volume. The number of silicon atoms and the number of oxygen atoms per unit volume are measured by Rutherford backscattering spectrometry.

As the material of the second region 102, silicon oxide, silicon nitride, silicon nitride oxide, silicon oxynitride, aluminum oxide, aluminum nitride, or aluminum oxynitride may be used. The second region 102 is an insulating layer which releases a smaller amount of oxygen than the first region 101. Note that the first region 101 may be formed using a material having constituent elements which are the same as or different from those of the material of the second region 102 or a material whose two or more constituent elements are the same as those of the material of the second region 102. In the case where the first region 101 is formed using the material having the same constituent elements as the material of the second region 102 or the a material whose two or more constituent elements are the same as those of the material of the second region 102, a material whose number of oxygen atoms per unit volume is smaller than that per unit volume of the first region 101 may be used as the material of the second region 102. For example, silicon oxide ($SiO_X$ ($X>2$)) in which the number of oxygen atoms is more than twice the number of silicon atoms per unit volume may be used as the material of the first region 101, whereas silicon oxide ($SiO_X$ ($X\leq2$)) whose number of oxygen atoms per unit volume is smaller than the number of oxygen atoms per unit volume of the first region 101 may be used as the material of the second region 102. Alternatively, silicon oxynitride whose number of oxygen atoms per unit volume is smaller than the number of oxygen atoms per unit volume of the first region 101 may be used as the material of the second region 102. Further alternatively, an organic insulating material which can be formed by wet process, such as an acrylic resin, polyimide, a benzocyclobutene resin, polyamide, or an epoxy resin, may be used as the material of the second region 102. Other than such organic insulating materials, an inorganic insulating material which can be formed by wet process, such as a low-dielectric constant material (a low-k material), a siloxane-based resin, phosphosilicate glass (PSG), or borophosphosilicate glass (BPSG), may be used. At a predetermined temperature (e.g., any of temperatures in the range of 100° C. to 650° C.), the oxygen diffusion coefficient of the second region 102 is preferably lower than that of the first region 101. Thus, the amount of oxygen which is released from the first region 101 and diffused into the second region 102 can be reduced.

The insulating layer 103 including the first region 101 and the second region 102 may be formed by stacking the above material and silicon oxide, silicon nitride, silicon oxynitride, silicon nitride oxide, aluminum oxide, aluminum nitride, aluminum oxynitride, a mixed material thereof, or the like. In the case where the insulating layer 103 is formed with a stacked structure, a layer in contact with the oxide semiconductor layer 106 is preferably formed using the material of the first region 101 and the material of the second region 102. Note that the insulating layer 103 functions as a base layer of the transistor 155.

As a material used for the oxide semiconductor layer 106, an In—Sn—Ga—Zn—O-based material, which is a four-component metal oxide; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material, which are three-component metal oxides; an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material, which are two-component metal oxides; an In—O-based material; a Sn—O-based material; a Zn—O-based material; or the like can be used. In addition, any of the above materials may contain silicon oxide. Here, for example, an In—Ga—Zn—O-based material means an oxide layer containing indium (In), gallium (Ga), and zinc (Zn), and there is no particular limitation on the composition ratio. Further, the In—Ga—Zn—O-based oxide semiconductor may contain an element other than In, Ga, and Zn.

In the case where an In—Zn—O-based material is used as the oxide semiconductor layer 106, the atomic ratio is set so that In/Zn is in greater than or equal to 0.5 and less than or equal to 50, preferably greater than or equal to 1 and less than or equal to 20, more preferably greater than or equal to 1.5 and less than or equal to 15. When the atomic ratio of Zn is in the above range, the field effect mobility of the transistor can be improved. Here, when the atomic ratio of the compound is In:Zn:O=X:Y:Z, it is preferable to satisfy the relation of $Z>1.5X+Y$.

Alternatively, the oxide semiconductor layer 106 can be formed using a thin film formed using a material represented by the chemical formula, $InMO_3(ZnO)_m$ (m>0). Here, M represents one or more metal elements selected from Ga, Al, Mn, and Co. For example, M can be Ga, Ga and Al, Ga and Mn, Ga and Co, or the like.

The channel region 126 and the first region 101 are in contact with each other, whereby the interface state density between the first region 101 and the channel region 126 and oxygen deficiency in the channel region 126 can be reduced. As a result, charge or the like which can be generated due to the operation of the semiconductor device or the like can be sufficiently prevented from being trapped at the interface between the first region 101 and the channel region 126.

Further, charge is generated due to oxygen deficiency of the channel region 126 in some cases. In general, part of oxygen deficiency in a channel region serves as a donor and generates electrons that are carriers. As a result, the threshold voltage of the transistor shifts in the negative direction. A sufficient amount of oxygen is released to the channel region 126 from the first region 101 that is an insulating layer in contact with the channel region 126, whereby the oxygen deficiency in the channel region 126, which causes the shift of the threshold voltage in the negative direction, can be compensated.

In other words, when oxygen deficiency is caused in the channel region 126, it is difficult to suppress charge trapping at the interface between the channel region 126 and the first region 101 that is an insulating layer in contact with the channel region 126. However, by providing an insulating layer from which oxygen is released by heating as the first region 101, the interface state density between the channel region 126 and the first region 101 and the oxygen deficiency in the channel region 126 can be reduced, and influence by the charge trapping at the interface between the channel region 126 and the first region 101 can be reduced.

In addition, the source region 122a and the drain region 122b are provided in contact with the second region 102 which releases a smaller amount of oxygen than the first region 101, so that oxygen is not supplied to the source region 122a and the drain region 122b. This is based on the fact that part of the oxygen deficiency in the oxide semiconductor layer generates electrons that are carriers. In other words, this is based on a technical idea that is to suppress the increase of the resistance of the source region 122a and the drain region 122b which is caused by the reduction of oxygen deficiency by supply of oxygen. For example, an insulating layer which releases oxygen of less than $1 \times 10^{18}$ atoms/cm$^3$ in TDS analysis can be used as the second region 102 in contact with the source region 122a and the drain region 122b.

Owing to an effect of suppressing the charge trapping at the interface of the channel region 126 of the oxide semiconductor layer and suppressing the increase of the resistance of the source region 122a and the drain region 122b, it is possible to suppress a malfunction such as the reduction of an on-state current of the transistor 155, to which the reduction of current flowing through the source region 122a and the drain region 122b which is caused by increasing the resistance of the source region 122a and the drain region 122b is attributed. In addition, a malfunction such as the increase of an off-state current of the transistor 155 including the oxide semiconductor and the shift of the threshold voltage can be suppressed. Further, the reliability of the semiconductor device can be improved.

The gate insulating layer 112 may include a structure (e.g., a material) similar to that of the first region 101. In other words, the gate insulating layer 112 may be an insulating layer from which oxygen is released by heating. Alternatively, a material having a high dielectric constant, such as hafnium oxide or aluminum oxide, may be used for the gate insulating layer 112 considering the function of the gate insulating layer of the transistor. In addition, considering a gate withstand voltage or the interface state with the oxide semiconductor, a material having a high dielectric constant, such as hafnium oxide or aluminum oxide, may be stacked on silicon oxide, silicon oxynitride, or silicon nitride.

The gate electrode 114 can be formed using a metal material such as molybdenum, titanium, tantalum, tungsten, aluminum, copper, neodymium, or scandium, nitride of any of these metal materials, or an alloy material which contains any of these metal materials as its main component. Note that the gate electrode 114 may have a single-layer structure or a stacked structure.

Further, the interlayer insulating layer 124 may be provided over the transistor 155. The interlayer insulating layer 124 may include a structure (e.g., a material) similar to that of the second region 102. In addition, an opening portion may be formed in the interlayer insulating layer 124 in order to obtain electrical connection of the wiring 108a and the wiring 108b with the source region 122a and the drain region 122b.

As the conductive layer used for the wiring 108a and the wiring 108b, for example, a metal layer containing an element selected from Al, Cr, Cu, Ta, Ti, Mo, and W, or a metal nitride layer containing any of the above elements as its component (e.g., a titanium nitride layer, a molybdenum nitride layer, or a tungsten nitride layer) can be used. A high-melting-point metal layer of Ti, Mo, W, or the like or a metal nitride layer of any of these elements (a titanium nitride layer, a molybdenum nitride layer, or a tungsten nitride layer) may be stacked on one of or both a bottom side and a top side of a metal layer of Al, Cu, or the like.

In the transistor 155, a second gate electrode may further be provided below the oxide semiconductor layer 106. Note that it is not always necessary but preferable to process the oxide semiconductor layer 106 into an island shape.

Examples of a manufacturing process of the transistor 155 in FIG. 1A will be described below with reference to FIGS. 2A to 2D, FIGS. 3A to 3D, FIGS. 4A to 4D, and FIGS. 5A and 5B.

First, an example of a manufacturing process of the transistor 155 illustrated in FIG. 1A will be described with reference to FIGS. 2A to 2D and FIGS. 3A to 3D.

Figure 2A:
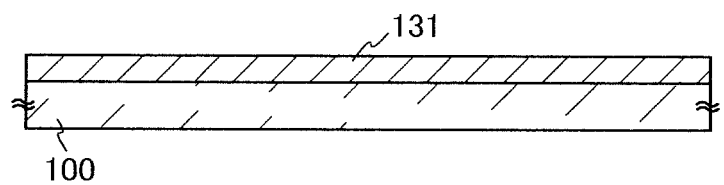
FIGS. 2A to 2D are cross-sectional views illustrating an example of a manufacturing process of a semiconductor device.
Figure 2B:
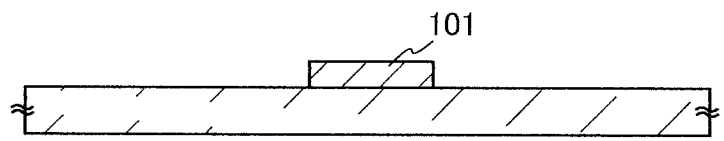

A first insulating layer 131 is formed over the substrate 100 (see FIG. 2A), and the first insulating layer 131 is processed by a method such as photolithography to form the island-shaped first region 101 (see FIG. 2B). A photomask used in the formation of the first region 101 can be the same as a photomask used in the formation of the gate electrode. Oxygen is released from the first region 101 by heating. As the material of the first region 101, oxygen-excess silicon oxide ($SiO_X$ (X>2)) may be used.

There is no particular limitation on the property of a material and the like of the substrate 100 as long as the material has heat resistance enough to withstand at least heat treatment to be performed later. For example, a glass substrate, a ceramic substrate, a quartz substrate, or a sapphire substrate can be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

A flexible substrate may alternatively be used as the substrate 100. In the case where a transistor is provided over the flexible substrate, the transistor may be directly formed on the flexible substrate. Alternatively, the transistor may be formed over a different substrate and then separated to be transferred to the flexible substrate that is the substrate 100. Note that in order to separate the transistor from the substrate and transfer it to the flexible substrate, a separation layer is preferably formed between the different substrate and the transistor.

As a formation method of the first insulating layer 131 which is to be the first region 101, a plasma CVD method or a sputtering method can be employed, for example. The insulating layer from which oxygen is released by heating is preferably formed by a sputtering method.

In order to form the insulating layer from which oxygen is released by heating by a sputtering method, in the case where oxygen or a mixed gas of oxygen and a rare gas (e.g., argon) is used as a deposition gas, the proportion of oxygen is preferably set higher. For example, the concentration of oxygen in the whole gas is preferably set to be higher than or equal to 6% and lower than 100%.

As the material of the first insulating layer 131 which is to be the first region 101, silicon oxide, silicon oxynitride, aluminum oxide, a mixed material of any of them, or the like may be used.

For example, as the first insulating layer 131, silicon oxide is formed by an RF sputtering method in the following conditions: quartz (preferably synthesized quartz) is used as a target; a substrate temperature is higher than or equal to 30° C. and lower than or equal to 450° C. (preferably higher than or equal to 70° C. and lower than or equal to 200° C.); oxygen or oxygen and argon are used as a deposition gas; and a proportion of $O_2/(O_2+Ar)$ in the deposition gas is greater than or equal to 1% and less than or equal to 100% (preferably greater than or equal to 6% and less than or equal to 100%).

The thickness of each of the first insulating layer 131 and the first region 101 is preferably greater than or equal to 50 nm and more preferably greater than or equal to 200 nm. The first insulating layer 131 and the first region 101 have large thicknesses, so that the amount of oxygen released from the first region 101 can be increased.

Figure 2C:
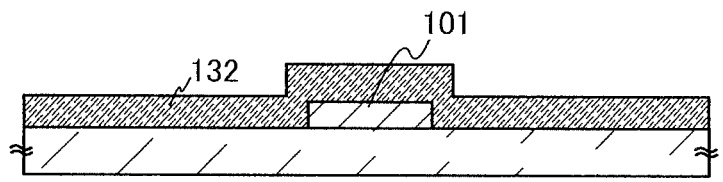
Figure 2D:
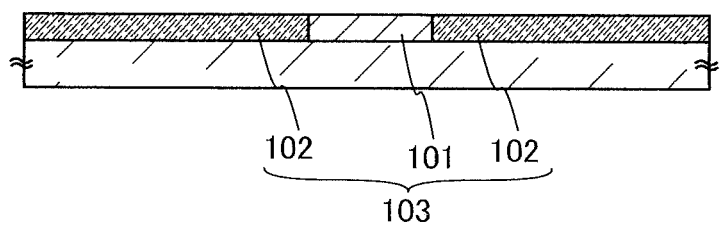

Next, a second insulating layer 132 is formed over the substrate 100 and the first region 101 (see FIG. 2C). After that, the second insulating layer 132 is processed until a surface of the first region 101 is exposed, so that the insulating layer 103 in which the second region 102 is in contact with the first region 101 is formed (see FIG. 2D). The second region 102 is an insulating layer which releases a smaller amount of oxygen than the first region 101. Note that in processing of the second insulating layer 132, a surface of the first region 101 may be processed at the same time so that part of the first region 101 is removed.

As a formation method for the second insulating layer 132, for example, a plasma CVD method, a sputtering method, or the like can be used.

As the material of the second insulating layer 132, silicon oxide, silicon nitride, silicon nitride oxide, silicon oxynitride, aluminum oxide, aluminum nitride, or aluminum oxynitride may be used.

For example, a silicon nitride film is formed by a plasma CVD method as the second insulating layer 132. Alternatively, as the second insulating layer 132, silicon oxide may be formed by a plasma CVD method.

After the above process, the surface of the first region 101 and the surface of the second region 102 are preferably aligned with each other. For example, the second insulating layer 132 is subjected to polishing treatment such as chemical mechanical polishing (CMP) or etching treatment until the surface of the first region 101 is exposed, so that the insulating layer 103, in which the second region 102 is in contact with the first region 101 and the surface of the first region 101 and the surface of the second region 102 are aligned with each other, can be formed. The alignment of the surface of the first region 101 and the surface of the second region 102 can lead to prevention of disconnection of the oxide semiconductor layer to be formed thereover. This effect is enhanced when the oxide semiconductor layer is thin. Prevention of the disconnection of the oxide semiconductor layer can lead to prevention of disconnection of the source region and the drain region, thereby suppressing reduction of the on-state current. In addition, disconnection of the gate insulating layer to be formed over the oxide semiconductor layer can be prevented. Prevention of the disconnection of the gate insulating layer can suppress the increase of leakage current and the reduction of a dielectric strength voltage.

Note that the thickness of the second region 102, that is, the thickness of the insulating layer 103 is the same as that of the first insulating layer 131 and that of the first region 101. Specifically, the thickness of the second region 102, that is, the thickness of the insulating layer 103 is preferably greater than or equal to 50 nm, more preferably greater than or equal to 200 nm. Note that the thickness of the first insulating layer 131 subjected to the polishing treatment or etching treatment may be smaller than that of the just-formed first insulating layer 131.

Alternatively, the insulating layer 103 including the first region 101 and the second region 102 may be formed by stacking the above material and silicon oxide, silicon nitride, silicon oxynitride, silicon nitride oxide, aluminum oxide, aluminum nitride, aluminum oxynitride, a mixed material thereof, or the like. In the case where the insulating layer 103 is formed with a stacked structure, a layer in contact with the oxide semiconductor layer 106 is preferably formed using the material of the first region 101 and the material of the second region 102. Note that the insulating layer 103 functions as a base layer of the transistor 155.

Note that the first region 101 is formed and then the second region 102 is formed here; however, the formation order of the first region 101 and the second region 102 may be inverted, that is, the second region 102 may be formed and then the first region 101 may be formed. In that case, after the second region 102 is selectively formed, the first insulating layer 131 is formed over the entire surface, and the first insulating layer 131 is subjected to polishing treatment or etching treatment until the surface of the second region 102 is exposed, so that the insulating layer 103 in which the second region 102 is in contact with the first region 101 can be formed.

Figure 3A:
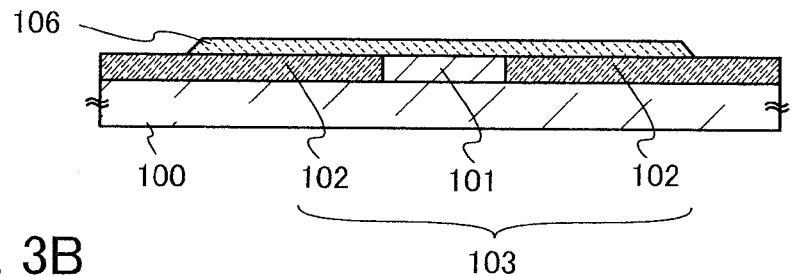
FIGS. 3A to 3D are cross-sectional views illustrating an example of a manufacturing process of a semiconductor device.
Figure 3B:
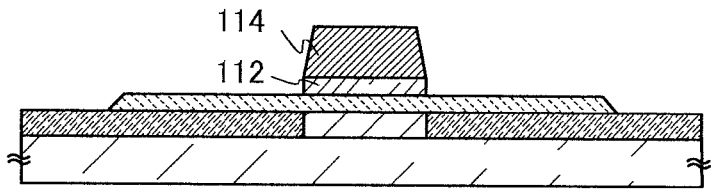
Figure 3C:
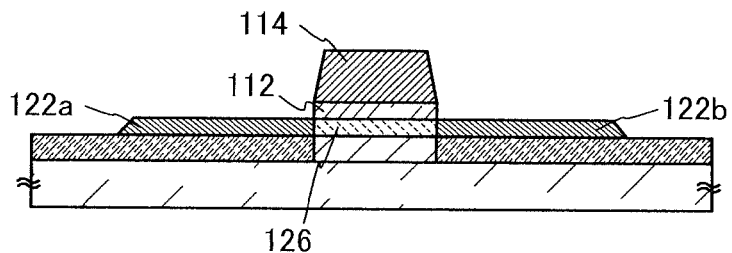
Figure 3D:
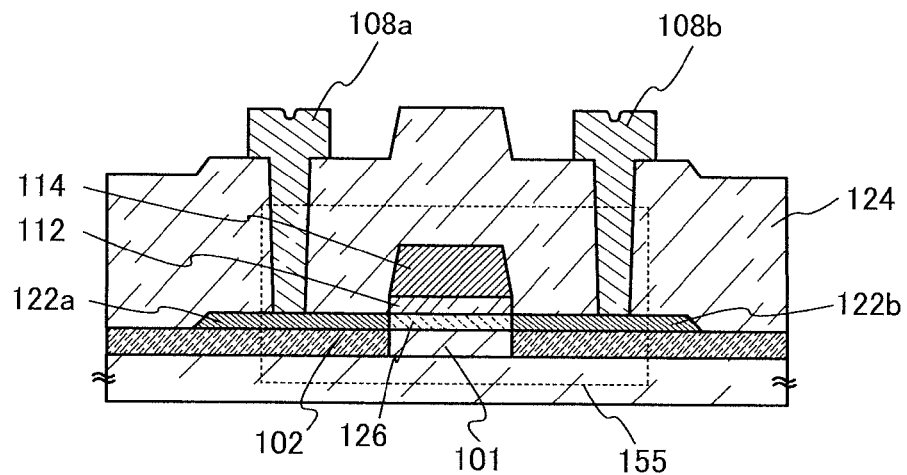

Next, an oxide semiconductor layer is formed over the insulating layer 103 and processed to form the island-shaped oxide semiconductor layer 106 (see FIG. 3A). The oxide semiconductor layer 106 is formed to be in contact with the first region 101 and the second region 102.

For example, the oxide semiconductor layer 106 can be formed by a sputtering method, a vacuum evaporation method, a pulse laser deposition method, a CVD method, or the like. The thickness of the oxide semiconductor layer 106 is preferably greater than or equal to 3 nm and less than or equal to 50 nm. This is because when the oxide semiconductor layer 106 is too thick (e.g., 100 nm or more), there is a possibility that the short channel effect has a large influence and the transistor with a small size is normally on. Here, "normally on" means a state where a channel exists without application of a voltage to a gate electrode and a current flows through the transistor.

In this embodiment, the oxide semiconductor layer 106 is formed by a sputtering method with the use of an In—Ga—Zn—O-based oxide target.

As the In—Ga—Zn—O-based oxide target, for example, an oxide target having a composition ratio of $In_2O_3$:$Ga_2O_3$:ZnO=1:1:1 [molar ratio] can be used. Note that it is not necessary to limit the material and the composition ratio of the target to the above. For example, an oxide target having a composition ratio of $In_2O_3$:$Ga_2O_3$:ZnO=1:1:2 [molar ratio] can be used.

The relative density of the oxide target is higher than or equal to 90% and lower than or equal to 100%, preferably higher than or equal to 95% to lower than or equal 100%. This is because, with the use of the metal oxide target with a high relative density, the dense oxide semiconductor layer can be formed.

The deposition atmosphere may be a rare gas (typically argon) atmosphere, an oxygen atmosphere, a mixed atmosphere containing a rare gas and oxygen, or the like. Moreover, it is preferably performed under an atmosphere using a high-purity gas in which impurities such as hydrogen, water, a hydroxyl group, and hydride are sufficiently removed so that entry of hydrogen, water, a hydroxyl group, and hydride into the oxide semiconductor layer can be prevented.

For example, the oxide semiconductor layer 106 can be formed as follows.

An example of the deposition conditions is as follows: the distance between the substrate and the target is 60 mm; the pressure is 0.4 Pa; the direct-current (DC) power is 0.5 kW; and the deposition atmosphere is a mixed atmosphere containing argon and oxygen (the flow rate of the oxygen is 33%). Note that a pulse DC sputtering method is preferable because powder substances (also referred to as particles or dust) generated in deposition can be reduced and the film thickness can be uniform.

At this time, the substrate temperature is set to higher than or equal to 100° C. and lower than or equal to 450° C., preferably higher than or equal to 150° C. and lower than or equal to 250° C., whereby oxygen is released from the first region 101, so that oxygen deficiency of a portion of the oxide semiconductor layer 106 in contact with the first region 101 (a portion to be the channel region 126) can be reduced, and the interface state density between the oxide semiconductor layer 106 and the first region 101 can be reduced.

When portions of the oxide semiconductor layer 106 which are not in contact with the first region 101 (portions to be the source region 122a and the drain region 122b) are in contact with the second region 102 which releases a smaller amount of oxygen than the first region 101, the increase of the resistance of the portions of the oxide semiconductor layer 106 can be suppressed.

Note that before the oxide semiconductor layer 106 is formed by a sputtering method, a substance attached to a surface where the oxide semiconductor layer 106 is to be formed (e.g., a surface of the insulating layer 103) may be removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface side in a rare atmosphere so that plasma is generated near the object to be processed. Note that, instead of a rare gas atmosphere, an atmosphere of nitrogen, oxygen, or the like may be used.

The oxide semiconductor layer 106 can be processed by etching after a mask having a desired shape is formed over the oxide semiconductor layer. The mask may be formed by a method such as photolithography or an ink-jet method. Alternatively, the mask may be formed by an ink-jet method or the like.

For the etching of the oxide semiconductor layer, either wet etching or dry etching may be employed. Needless to say, both of them may be employed in combination.

After that, heat treatment (first heat treatment) is preferably performed on the oxide semiconductor layer 106. By the first heat treatment, excessive hydrogen (including water and a hydroxyl group) in the oxide semiconductor layer 106 can be removed. The temperature of the first heat treatment is higher than or equal to 100° C. and lower than or equal to 650° C. or lower than the strain point of the substrate, preferably higher than or equal to 250° C. and lower than or equal to 600° C. The atmosphere of the first heat treatment is an oxidation gas atmosphere or an inert gas atmosphere.

Note that the inert gas contains nitrogen or a rare gas (e.g., helium, neon, or argon) as its main component and preferably does not contain water, hydrogen, or the like. For example, the purity of nitrogen or a rare gas such as helium, neon, or argon introduced into a heat treatment apparatus is set to 6N (99.9999%) or higher, preferably 7N (99.99999%) or higher (i.e., the impurity concentration is 1 ppm or lower, preferably 0.1 ppm or lower). The inert gas atmosphere is an atmosphere that contains an inert gas as its main component and contains a reactive gas at a concentration less than 10 ppm.

Note that the oxidation gas is oxygen, ozone, nitrogen dioxide, or the like, and it is preferable that the oxidation gas does not contain water, hydrogen, and the like. For example, the purity of oxygen, ozone, or nitrogen dioxide introduced into a heat treatment apparatus is set to 6N (99.9999%) or higher, preferably 7N (99.99999%) or higher (i.e., the impurity concentration is 1 ppm or lower, preferably 0.1 ppm or lower). As the oxidation gas atmosphere, an atmosphere in which an oxidation gas is mixed with an inert gas may be used, and the oxidation gas of at least 10 ppm is contained.

By the first heat treatment, oxygen is released from the first region 101, so that the interface state density between the first region 101 and the portion of the oxide semiconductor layer 106 which is in contact with the first region 101 (the portion to be the channel region 126) can be reduced, and the oxygen deficiency in the portion of the oxide semiconductor layer 106 which is in contact with the first region 101 can be reduced. By the above reduction of the interface state density, the fluctuation in the threshold voltage after a BT test can be reduced. Further, in general, it is known that part of the oxygen deficiency in an oxide semiconductor layer serves as a donor and generates electrons that are carriers. By the generation of electrons in the oxide semiconductor layer 106, the threshold voltage of the transistor 155 shifts in the negative direction, so that the transistor 155 tends to be normally on. The oxygen deficiency in the oxide semiconductor layer 106 is compensated, whereby the amount of the shift of the threshold voltage in the negative direction can be reduced.

In addition, the portions of the oxide semiconductor layer 106 which are not in contact with the first region 101 (the portions to be the source region 122a and the drain region 122b) are in contact with the second region 102 which releases a smaller amount of oxygen than the first region 101, whereby the increase of the resistance of the portions of the oxide semiconductor layer 106 can be suppressed.

The heat treatment can be performed in such a manner that, for example, an object is introduced into an electric furnace in which a resistance heating element or the like is used and heated at 350° C. in a nitrogen atmosphere for an hour. During the heat treatment, the oxide semiconductor layer is not exposed to the air to prevent the entry of water and hydrogen.

Note that the heat treatment apparatus is not limited to an electric furnace, and may include a device for heating an object by heat conduction or heat radiation from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high temperature gas, used is an inert gas which does not react with an object to be processed in heat treatment, for example, nitrogen or a rare gas such as argon.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas atmosphere may be switched to an atmosphere containing an oxidation gas during the treatment. This is because by performing the first heat treatment in an atmosphere containing the oxidation gas, oxygen deficiency in the oxide semiconductor layer 106 can be compensated and defect levels in an energy gap due to the oxygen deficiency can be reduced.

The above heat treatment (first heat treatment) can be referred to as dehydration treatment, dehydrogenation treatment, or the like because of its advantageous effect of removing hydrogen, water, and the like. In addition, the above heat treatment can also be referred to as treatment for supplying oxygen because of its advantageous effect of supplying oxygen from the insulating layer, a heat treatment atmosphere, or the like. The dehydration treatment, dehydrogenation treatment, or treatment for supplying oxygen may be performed at the timing, for example, after the oxide semiconductor layer is processed to have an island shape. Such dehydration treatment, dehydrogenation treatment, or treatment for supplying oxygen may be performed once or plural times.

Note that the case is described here where the first heat treatment is performed after the oxide semiconductor layer 106 is processed to have an island shape; however, one embodiment of the present invention is not limited thereto. The oxide semiconductor layer 106 may be processed after the first heat treatment.

Next, an insulating layer is formed to be in contact with the oxide semiconductor layer 106, and a conductive layer is formed to be in contact with the insulating layer. The insulating layer and the conductive layer are processed to the same pattern by photolithography to form the gate insulating layer 112 and the gate electrode 114 (see FIG. 3B). In other words, the gate electrode 114 and the gate insulating layer 112 can be formed using the same mask. Alternatively, the gate electrode 114 may be formed and then, the gate insulating layer 112 may be formed using the gate electrode 114 as a mask.

The gate insulating layer 112 may includes a structure (e.g., a material) similar to that of the first region 101. Alternatively, a material having a high dielectric constant, such as hafnium oxide or aluminum oxide, may be used for the gate insulating layer 112 considering the function of the gate insulating layer of the transistor. In addition, considering a gate withstand voltage or the interface state with the oxide semiconductor, a material having a high dielectric constant, such as hafnium oxide or aluminum oxide, may be stacked on silicon oxide, silicon oxynitride, or silicon nitride. The total thickness of the gate insulating layer 112 is preferably greater than or equal to 1 nm and less than or equal to 300 nm, more preferably greater than or equal to 5 nm and less than or equal to 50 nm. As the thickness of the gate insulating layer is larger, a short channel effect is enhanced more and the threshold voltage tends to shift more in the negative side. In addition, it is found that when the thickness of the gate insulating layer is less than or equal to 5 nm, leakage due to a tunnel current is increased.

Second heat treatment is preferably performed after the gate insulating layer 112 is formed. The temperature of the second heat treatment is higher than or equal to 100° C. and lower than or equal to 650° C. or lower than the strain point of the substrate, preferably higher than or equal to 250° C. and lower than or equal to 600° C. or lower than the strain point of the substrate.

The second heat treatment may be performed under an atmosphere of an oxidation gas or an inert gas. It is preferable that the atmosphere of an oxidation gas or an inert gas do not contain water, hydrogen, and the like. Further, the purity of the gas introduced into a heat treatment apparatus is preferably set to 6N (99.9999%) or higher, more preferably 7N (99.99999%) or higher (that is, the impurity concentration is 1 ppm or lower, preferably 0.1 ppm or lower).

The second heat treatment is performed while the oxide semiconductor layer 106 is in contact with the first region 101 and the gate insulating layer 112. Thus, oxygen, which is one of main components of the oxide semiconductor, can be supplied from the first region 101 and the gate insulating layer 112 which contain oxygen, to the oxide semiconductor layer 106. Accordingly, oxygen deficiency in the oxide semiconductor layer 106, the interface state density between the first region 101 and the oxide semiconductor layer 106, and the interface state density between the oxide semiconductor layer and the gate insulating layer 112 can be reduced. At the same time, deficiency in the gate insulating layer 112 can also be reduced.

Note that there is no particular limitation on the timing of the second heat treatment as long as it is after the gate insulating layer 112 is formed. The second heat treatment may be performed plural times.

The gate electrode 114 can be formed using a metal material such as molybdenum, titanium, tantalum, tungsten, aluminum, copper, neodymium, or scandium, nitride of any of these metal materials, or an alloy material which contains any of these metal materials as its main component. Note that the gate electrode 114 may have a single-layer structure or a stacked structure.

Next, the resistance of the oxide semiconductor layer 106 is reduced using the gate electrode 114 as a mask, so that the source region 122a and the drain region 122b are formed. A region under the gate electrode 114 where the resistance is not reduced becomes the channel region 126 (see FIG. 3C). As a method for reducing the resistance, argon plasma treatment, hydrogen plasma treatment, ammonia plasma treatment, and the like can be given. At this time, the channel length L of the transistor is determined by the width of the gate electrode 114. By patterning using the gate electrode 114 as the mask in this manner, the source region 122a and the drain region 122b do not overlap with the gate electrode 114 and parasitic capacitance in the region is not generated; therefore, the operation speed of the transistor can be increased.

Next, the interlayer insulating layer 124 is formed and an opening portion is provided in a region of the interlayer insulating layer 124 which overlaps with the source region 122a and the drain region 122b. Then, a conductive layer is formed and processed to form the wiring 108a and the wiring 108b (see FIG. 3D).

As the conductive layer used for the wiring 108a and the wiring 108b, for example, a metal layer containing an element selected from Al, Cr, Cu, Ta, Ti, Mo, and W, or a metal nitride layer containing any of the above elements as its component (e.g., a titanium nitride layer, a molybdenum nitride layer, or a tungsten nitride layer) can be used. A high-melting-point metal layer of Ti, Mo, W, or the like or a metal nitride layer of any of these elements (a titanium nitride layer, a molybdenum nitride layer, or a tungsten nitride layer) may be stacked on one of or both a bottom side and a top side of a metal layer of Al, Cu, or the like.

Alternatively, the conductive layer used for the wiring 108a and the wiring 108b may be formed using a conductive metal oxide. As the conductive metal oxide, indium oxide ($In_2O_3$ or the like), tin oxide ($SnO_2$ or the like), zinc oxide (ZnO or the like), indium oxide-tin oxide alloy ($In_2O_3$—$SnO_2$ or the like, which is abbreviated to ITO), indium oxide-zinc oxide alloy ($In_2O_3$—ZnO or the like), or any of these metal oxide materials in which silicon oxide is contained can be used.

The conductive layer can be processed by etching with the use of a resist mask. Ultraviolet, a KrF laser light, an ArF laser light, or the like is preferably used for light exposure for forming a resist mask for the etching.

Through the above process, the transistor 155 is formed.

Next, an example of a manufacturing process of the insulating layer 103 is described with reference to FIGS. 4A to 4D. First, through the same process as FIGS. 2A to 2C, the first region 101 is formed over the substrate 100, and the second insulating layer 132 is formed over the substrate 100 and the first region 101 (see FIG. 4A). Then, a third insulating layer 133 is formed over the second insulating layer 132 (see FIG. 4B). As the third insulating layer 133, a planarization insulating layer can be used. For example, as a material of the third insulating layer 133, an organic insulating material which can be formed by wet process, such as an acrylic resin, polyimide, a benzocyclobutene resin, polyamide, or an epoxy resin can be used. Other than such organic insulating materials, it is possible to use an inorganic insulating material which can be formed by wet process, such as a low-dielectric constant material (a low-k material), a siloxane-based resin, phosphosilicate glass (PSG), or borophosphosilicate glass (BPSG).

The third insulating layer 133 can be formed, depending on the material, by a spin coating method, a dipping method, spray coating, a droplet discharge method (e.g., an inkjet method, screen printing, or offset printing), roll coating, curtain coating, knife coating, or the like.

Then, the third insulating layer 133 and the second insulating layer 132 are subjected to etching treatment. An etchant whose etching selection ratio of the third insulating layer 133 and the second insulating layer 132 is 1:1 or close to 1:1 is used for the etching treatment. Accordingly, an etching rate of the third insulating layer 133 can be substantially the same as an etching rate of the second insulating layer 132 (see FIG. 4C). Note that the third insulating layer 133 and the second insulating layer 132 may be etched by either dry etching or wet etching.

Figure 4A:
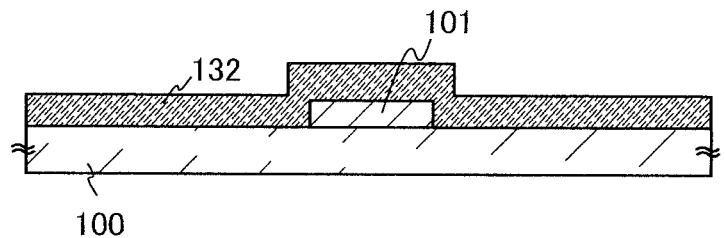
FIGS. 4A to 4D are cross-sectional views illustrating an example of a manufacturing process of a semiconductor device.
Figure 4B:
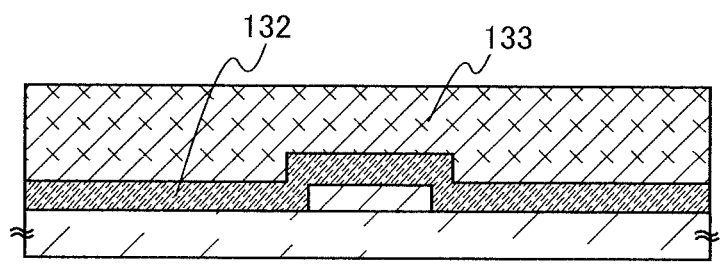
Figure 4C:
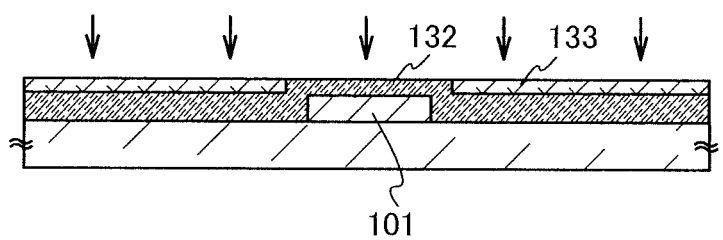
Figure 4D:
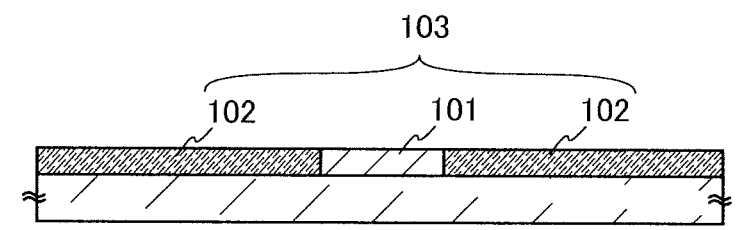

Then, the third insulating layer 133 and the second insulating layer 132 are subjected to the etching treatment until the surface of the first region 101 is exposed, so that the insulating layer 103, in which the second region 102 is in contact with the first region 101, and the surface of the first region 101 and the surface of the second region 102 are aligned with each other can be formed (see FIG. 4D). The alignment of the surface of the first region 101 and the surface of the second region 102 can lead to prevention of disconnection of the oxide semiconductor layer to be formed thereover. This effect is enhanced when the oxide semiconductor layer 106 is thin. Prevention of the disconnection of the oxide semiconductor layer 106 can prevent disconnection of the source region 122a and the drain region 122b and can suppress the reduction of the on-state current. In addition, disconnection of the gate insulating layer 112 to be formed over the oxide semiconductor layer 106 can be prevented. Prevention of the disconnection of the gate insulating layer 112 can suppress the increase of leakage current and the reduction of a dielectric strength voltage.

Note that the first region 101 is formed and then the second region 102 is formed here; however, the formation order of the first region 101 and the second region 102 may be inverted, that is, the second region 102 may be formed and then the first region 101 may be formed. In that case, after the second region 102 is selectively formed, the first insulating layer 131 is formed over the entire surface, and the third insulating layer 133 is formed over the first insulating layer 131. Then, the third insulating layer 133 and the first insulating layer 131 are subjected to polishing treatment or etching treatment until the surface of the second region 102 is exposed, so that the insulating layer 103 in which the second region 102 is in contact with the first region 101 and the surface of the first region 101 and the surface of the second region 102 are aligned with each other can be formed. Also in that case, the third insulating layer 133 and the first insulating layer 131 may be etched by either dry etching or wet etching.

Figure 5A:
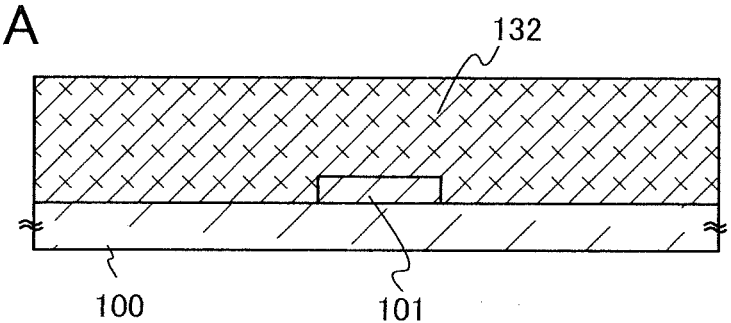
FIGS. 5A and 5B are cross-sectional views illustrating an example of a manufacturing process of a semiconductor device.
Figure 5B:
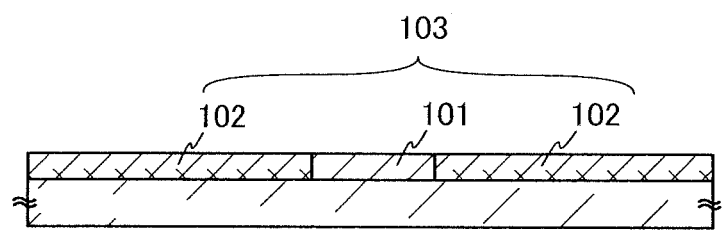

Here, the second insulating layer 132 and the third insulating layer 133 are formed; however, the second insulating layer 132 may be formed with the use of the same material and the same method as those of the third insulating layer 133, so that the second insulating layer 132 having a even surface may be formed. In other words, as illustrated in FIG. 5A, the second insulating layer 132 having the even surface may be formed over the substrate 100 and the first region 101 with the use of the same material and the same method as those of the third insulating layer 133. The second insulating layer 132 having the even surface is subjected to etching treatment until the surface of the first region 101 is exposed, so that the second region 102 can be formed as illustrated in FIG. 5B. As a result, the insulating layer 103 in which the surface of the first region 101 and the surface of the second region 102 are aligned with each other can be formed. Also in that case, the material used as the second region 102 is an insulating layer which releases a smaller amount of oxygen than the first region 101. Through the manufacturing method illustrated in FIGS. 5A and 5B, the number of depositions for forming the insulating layer 103 is smaller than that of the manufacturing method illustrated in FIGS. 4A to 4D and processing becomes easier.

The subsequent steps can be the same as those of FIG. 3A to 3D.

According to this embodiment, the first region 101 from which oxygen is released by heating is provided as an insulating layer in contact with the channel region 126 of the oxide semiconductor layer 106, and the second region 102 which releases a smaller amount of oxygen than the first region 101 is provided as the insulating layer in contact with the source region 122a and the drain region 122b of the oxide semiconductor layer 106. As a result, a transistor having a small off-state current, small variation in the threshold voltage, a large on-state current, and stable electrical characteristics can be provided.

According to this embodiment, a semiconductor device including a highly reliable transistor having favorable electric characteristics is provided.

The methods and structures described in this embodiment can be combined as appropriate with any of the methods and structures described in the other embodiments.

Embodiment 2

Figure 6:
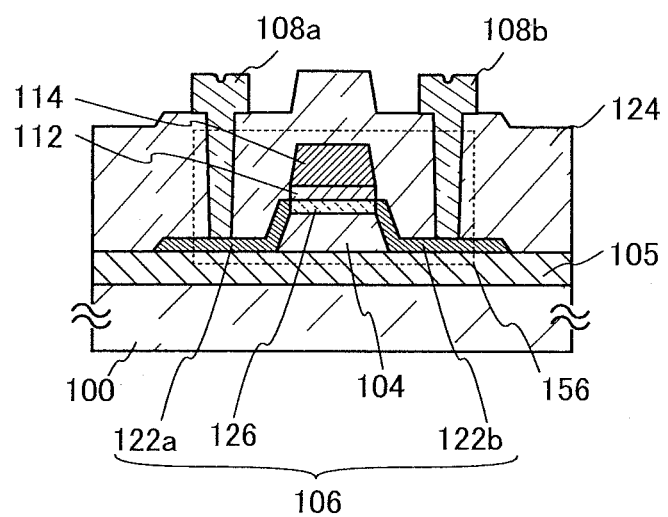
FIG. 6 is a cross-sectional view illustrating one embodiment of a semiconductor device.

In this embodiment, an embodiment of a semiconductor device will be described with reference to FIG. 6. FIG. 6 illustrates a cross section of a transistor 156 having a structure which is different from that of the transistor 155 illustrated in FIG. 1A. The transistor 156 illustrated in FIG. 6 is different from the transistor 155 illustrated in FIG. 1A in that the second region 102 is not provided.

The transistor 156 in FIG. 6 includes a first insulating layer 104, an oxide semiconductor layer 106, a gate insulating layer 112, and a gate electrode 114, which are over a substrate 100. The transistor 156 includes, in the oxide semiconductor layer 106, a channel region 126, a source region 122a, and a drain region 122b. The channel region 126, the source region 122a, and the drain region 122b are provided in the same layer.

A second insulating layer 105 may be provided below the transistor 156. The second insulating layer 105 functions as a base layer of the transistor 156.

The first insulating layer 104 is selectively provided over the substrate 100 or the second insulating layer 105 provided over the substrate 100. The oxide semiconductor layer 106 is provided over the first insulating layer 104. The oxide semiconductor layer 106 is provided in contact with the first insulating layer 104 and the substrate 100 or the second insulating layer 105 provided over the substrate 100. The channel region 126 of the oxide semiconductor layer 106 is provided in contact with the first insulating layer 104. The source region 122a and the drain region 122b of the oxide semiconductor layer 106 are provided in contact with the substrate 100 or the second insulating layer 105 provided over the substrate 100.

The gate insulating layer 112 is provided in contact with the oxide semiconductor layer 106. The gate electrode 114 is provided in contact with the gate insulating layer 112. An interlayer insulating layer 124 is provided over the gate electrode 114. A wiring 108a and a wiring 108b are electrically connected to the source region 122a and the drain region 122b, respectively, through the interlayer insulating layer 124. The wiring 108a and the wiring 108b function as a source electrode and a drain electrode.

The material of the first insulating layer 104 can have the same structure as the material of the first region 101 described in Embodiment 1. In other words, as the material of the first insulating layer 104, silicon oxide, silicon oxynitride, aluminum oxide, a mixed material of any of them, or the like may be used. Oxygen is released from the first insulating layer 104 by heating. To release oxygen by heating means that the released amount of oxygen which is converted to oxygen atoms is greater than or equal to $1\times10^{18}$ atoms/cm$^3$, preferably greater than or equal to $3\times10^{20}$ atoms/cm$^3$ in thermal desorption spectroscopy (TDS). Alternatively, as the material of the first insulating layer 104, oxygen-excess silicon oxide (SiO$_X$ (X>2)) may be used. In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

In the case where the second insulating layer 105 is provided, the material of the second insulating layer 105 can have the same structure as the material of the second region 102 described in Embodiment 1. In other words, as the material of the second insulating layer 105, silicon oxide, silicon nitride, silicon nitride oxide, silicon oxynitride, aluminum oxide, aluminum nitride, aluminum oxynitride, or the like may be used. The second insulating layer 105 is an insulating layer which releases a smaller amount of oxygen than the first insulating layer 104.

In addition, the first insulating layer 104 and/or the second insulating layer 105 may be formed by stacking the above material and silicon oxide, silicon nitride, silicon oxynitride, silicon nitride oxide, aluminum oxide, aluminum nitride, aluminum oxynitride, a mixed material thereof, or the like. In the case where the first insulating layer 104 and/or the second insulating layer 105 are/is formed with a stacked structure, a layer in contact with the oxide semiconductor layer 106 may be formed using the material of the first insulating layer 104 or the material of the second insulating layer 105.

The channel region 126 and the first insulating layer 104 are in contact with each other, whereby the interface state density between the first insulating layer 104 and the channel region 126 and oxygen deficiency in the channel region 126 can be reduced. Owing to the reduction of the interface state density, the shift of the threshold voltage in the negative direction after a BT test can be suppressed. Alternatively, generation of carriers can be suppressed, so that normally-off characteristics can be obtained.

In addition, the source region 122a and the drain region 122b are in contact with the substrate 100 or the second insulating layer 105, whereby the increase of the resistance of the source region 122a and the drain region 122b can be prevented, so that a semiconductor device including the highly reliable transistor 156 with good electrical characteristics can be provided.

There is no particular limitation on the property of a material and the like of the substrate 100 as long as the material has heat resistance enough to withstand at least heat treatment to be performed later. For example, a glass substrate, a ceramic substrate, a quartz substrate, or a sapphire substrate can be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

A flexible substrate may alternatively be used as the substrate 100. In the case where a transistor is provided over the flexible substrate, the transistor may be directly formed on the flexible substrate. Alternatively, the transistor may be formed over a different substrate and then separated to be transferred to the flexible substrate that is the substrate 100. Note that in order to separate the transistor from the substrate and transfer it to the flexible substrate, a separation layer is preferably formed between the different substrate and the transistor.

Note that in the case where the second insulating layer 105 is not provided, a substrate formed of a material which releases a smaller amount of oxygen than the first insulating layer 104 is preferably used as the substrate 100. For example, in the case where the second insulating layer 105 is not provided, a glass substrate, a ceramics substrate, a quartz substrate, a sapphire substrate, an SOI substrate, or the like is preferably used as the substrate 100.

A manufacturing process of the transistor 156 is described. The second insulating layer 105 is formed over the entire surface of the substrate 100 and the first insulating layer 104 is selectively formed over the second insulating layer 105. Oxygen is released from the first insulating layer 104 by heating. As the material of the first insulating layer 104, oxygen-excess silicon oxide ($SiO_X$ (X>2)) may be used. In order to improve a coverage with the oxide semiconductor layer 106 to be formed later, the edge portion of the first insulating layer 104 is preferably formed to have a slope. In addition, a photomask used in the formation of the first insulating layer 104 can be the same as the photomask used in the formation of the gate electrode 114.

The subsequent steps can be the same as those described in Embodiment 1.

Since a step for aligning the surfaces of the insulating layers can be omitted in this embodiment, the transistor 156 can be provided by a simple method with low cost and high throughput.

According to this embodiment, the first insulating layer 104 from which oxygen is released by heating is provided as an insulating layer in contact with the channel region 126 of the oxide semiconductor layer 106, and the substrate 100 or the second insulating layer 105 which releases a smaller amount of oxygen than the first insulating layer 104 is provided as a substrate or an insulating layer in contact with the source region 122a and the drain region 122b of the oxide semiconductor layer 106. As a result, a transistor having a small off-state current, small variation in the threshold voltage, a large on-state current, and stable electrical characteristics can be provided.

According to this embodiment, a highly reliable semiconductor device having good electric characteristics is provided.

The structures, methods, and the like described in this embodiment can be combined as appropriate with any of the structures, methods, and the like described in the other embodiments.

Embodiment 3

Figure 9A:
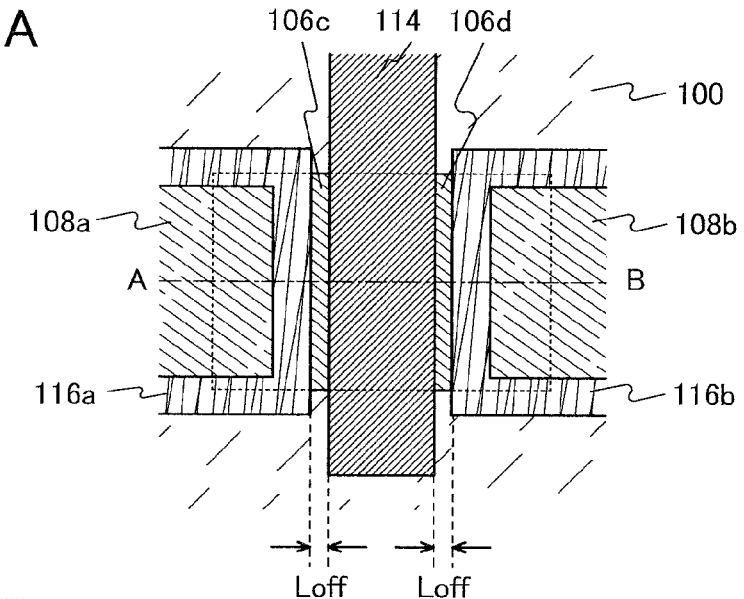
FIG. 9A to 9C are a top view and cross-sectional views illustrating one embodiment of a semiconductor device.
Figure 9B:
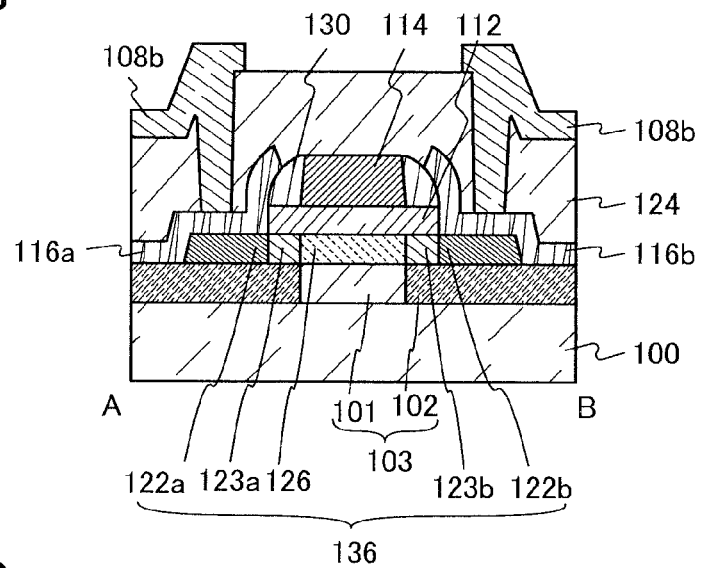
Figure 9C:
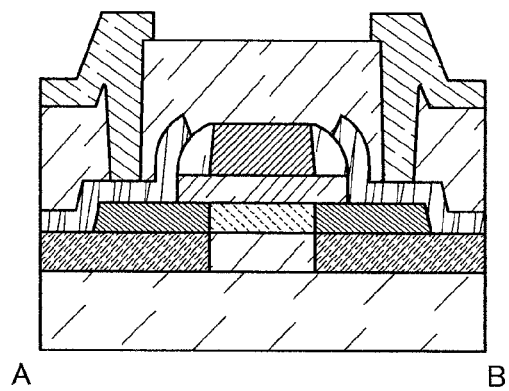

In this embodiment, an embodiment of a semiconductor device will be described with reference to FIGS. 9A to 9C. FIG. 9A is a top view of a transistor. FIG. 9B illustrates a cross-sectional structure corresponding to an alternate long and short dashed line A-B in FIG. 9A.

A transistor illustrated in FIG. 9B includes an insulating layer 103, an oxide semiconductor layer 136, a gate insulating layer 112, a gate electrode 114, a sidewall insulating layer 130, a source electrode 116a, and a drain electrode 116b over a substrate 100. The insulating layer 103 includes a first region 101 and a second region 102. The transistor illustrated in FIG. 9B includes a channel region 126, a source region 122a, a drain region 122b, an offset region 123a, and an offset region 123b in the oxide semiconductor layer 136. The channel region 126, the source region 122a, the drain region 122b, the offset region 123a, and the offset region 123b are provided in the same layer.

The offset region 123a and the offset region 123b have lower resistance than the channel region 126 and have higher resistance than the source region 122a and the drain region 122b. The width of the offset region 123a or the offset region 123b is also referred to as Loff, which is illustrated in FIG. 9A. With the Loff, a short-channel effect of the transistor is reduced. Therefore, in the case of using a minute transistor in which a short-channel effect is notably enhanced, the structure illustrated in FIG. 9B (also referred to as a Loff structure) is favorable. In addition, by employing the Loff structure, degradation of the transistor, such as hot-carrier degradation, can be reduced.

The oxide semiconductor layer 136 is provided in contact with the first region 101 and the second region 102. The channel region 126 of the oxide semiconductor layer 136 is provided in contact with the first region 101. The source region 122a, the drain region 122b, the offset region 123a, and the offset region 123b are provided in contact with the second region 102. The offset region 123a and the offset region 123b are closer to the channel region 126 than the source region 122a and the drain region 122b are.

The gate insulating layer 112 is provided in contact with the channel region 126, the offset region 123a, and the offset region 123b. The sidewall insulating layer 130 is provided in the periphery of the gate electrode 114. The gate electrode 114 and the sidewall insulating layer 130 are provided in contact with the gate insulating layer 112. An interlayer insulating layer 124 is provided over the gate electrode 114 and the sidewall insulating layer 130. The source electrode 116a and the drain electrode 116b are provided in contact with the source region 122a and the drain region 122b, respectively. A wiring 108a and a wiring 108b are electrically connected to the source electrode 116a and the drain electrode 116b through the interlayer insulating layer 124.

As a conductive layer used for the source electrode 116a and the drain electrode 116b, for example, a metal layer containing an element selected from Al, Cr, Cu, Ta, Ti, Mo, and W, or a metal nitride layer containing any of the above elements as its component (e.g., a titanium nitride layer, a molybdenum nitride layer, or a tungsten nitride layer) can be used. A high-melting-point metal layer of Ti, Mo, W, or the like or a metal nitride layer of any of these elements (a titanium nitride layer, a molybdenum nitride layer, or a tungsten nitride layer) may be stacked on one of or both a bottom side and a top side of a metal layer of Al, Cu, or the like.

In addition, the offset region 123a and the offset region 123b are provided in contact with the second region 102 which releases a smaller amount of oxygen than the first region 101, so that oxygen is not supplied to the offset region 123a and the offset region 123b.

The offset region 123a and the offset region 123b are not regions whose resistance is particularly reduced, and are distinguished from the channel region 126 depending on which region of the insulating layer 103 is in contact with the offset region 123a and the offset region 123b. That is, the offset region 123a and the offset region 123b are regions of the oxide semiconductor layer 136 which are not in contact with the insulating layer from which oxygen is released by heating.

The transistor described in this embodiment includes the offset regions, whereby the highly reliable transistor having better electrical characteristics can be provided.

Note that the offset regions are not necessarily provided. For example, a transistor illustrated in FIG. 9C has a different structure from the transistor of FIG. 9B in that offset regions are not provided.

According to this embodiment, a semiconductor device including a highly reliable transistor having good electrical characteristics can be provided.

The structures, methods, and the like described in this embodiment can be combined as appropriate with any of the structures, methods, and the like described in the other embodiments.

Embodiment 4

A semiconductor device having a display function (also referred to as a display device) can be manufactured using the transistor described in Embodiment 1, Embodiment 2, or Embodiment 3. Moreover, some or all of the driver circuits which include the transistor can be formed over a substrate where the pixel portion is formed, whereby a system-on-panel can be obtained.

Figure 7A:
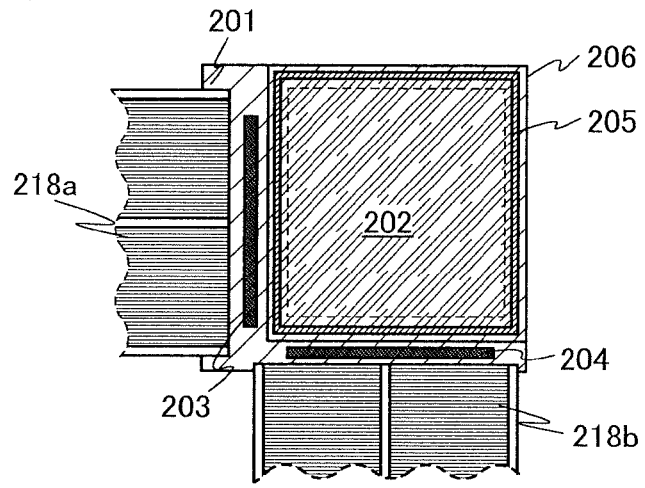
FIGS. 7A to 7C each illustrate one embodiment of a semiconductor device.

In FIG. 7A, a sealant 205 is provided so as to surround a pixel portion 202 provided over a first substrate 201, and the pixel portion 202 is sealed with the sealant 205 between the first substrate 201 and a second substrate 206. In FIG. 7A, a scan line driver circuit 204 and a signal line driver circuit 203 each are formed using a single crystal semiconductor layer or a polycrystalline semiconductor layer over a substrate prepared separately, and mounted in a region different from the region surrounded by the sealant 205 over the first substrate 201. Various signals and potentials are supplied to the signal line driver circuit 203 and the scan line driver circuit 204, each of which is separately formed, and the pixel portion 202, from flexible printed circuits (FPCs) 218a and 218b.

Figure 7B:
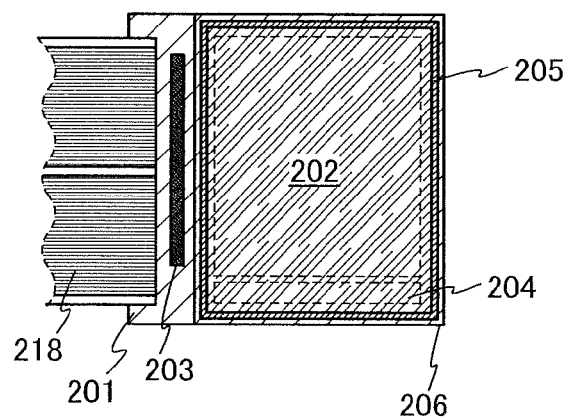
Figure 7C:
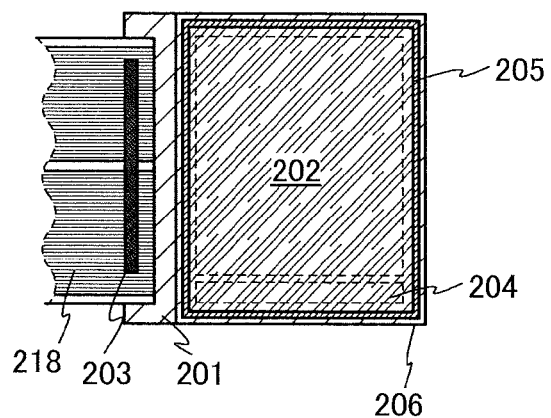

In FIGS. 7B and 7C, the sealant 205 is provided to surround the pixel portion 202 and the scan line driver circuit 204 which are provided over the first substrate 201. The second substrate 206 is provided over the pixel portion 202 and the scan line driver circuit 204. Thus, the pixel portion 202 and the scan line driver circuit 204 are sealed together with a display element, by the first substrate 201, the sealant 205, and the second substrate 206. In FIGS. 7B and 7C, the signal line driver circuit 203 is formed using a single crystal semiconductor layer or a polycrystalline semiconductor layer over a substrate prepared separately, and mounted in a region different from the region surrounded by the sealant 205 over the first substrate 201. In FIGS. 7B and 7C, various signals and potentials are supplied from a FPC 218 to the signal line driver circuit 203 which is separately formed, the scan line driver circuit 204, and the pixel portion 202.

Although FIGS. 7B and 7C each show the example in which the signal line driver circuit 203 is formed separately and mounted on the first substrate 201, one embodiment of the present invention is not limited to this structure. The scan line driver circuit may be formed separately and then mounted, or only part of the signal line driver circuit or part of the scan line driver circuit may be formed separately and then mounted.

Note that a connection method of a separately formed driver circuit is not particularly limited, and a chip on glass (COG) method, a wire bonding method, a tape automated bonding (TAB) method or the like can be used. FIG. 7A shows an example in which the signal line driver circuit 203 and the scan line driver circuit 204 are mounted by a COG method. FIG. 7B shows an example in which the signal line driver circuit 203 is mounted by a COG method. FIG. 7C shows an example in which the signal line driver circuit 203 is mounted by a TAB method.

The display device includes in its category a panel in which a display element is sealed and a module in which an IC such as a controller is mounted on the panel.

Note that a display device in this specification means an image display device, a display device, or a light source (including a lighting device). The display device includes any of the following modules: a module provided with a connector such as an FPC, a TAB tape, or TCP; a module in which a printed wiring board is provided in the end of a TAB tape or TCP; and a module in which an integrated circuit (IC) is mounted directly on a display element by a COG method.

Further, the pixel portion and the scan line driver circuit which are provided over the first substrate 201 include a plurality of transistors, to which the transistor whose example is described in Embodiment 1, Embodiment 2, or Embodiment 3 can be applied.

As the display element provided in the display device, a liquid crystal element (also referred to as a liquid crystal display element) or a light-emitting element (also referred to as a light-emitting display element) can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment layer is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed is used for the liquid crystal layer in order to improve the temperature range. The liquid crystal composition which includes a liquid crystal exhibiting a blue phase and a chiral agent has a short response time of 1 msec or less, has optical isotropy, which makes the alignment process unneeded, and has a small viewing angle dependence. In addition, since an alignment layer does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1 \times 10^9$ Ω·cm or more, preferably $1 \times 10^{11}$ Ω·cm or more, more preferably $1 \times 10^{12}$ Ω·cm or more. The value of the specific resistivity in this specification is measured at 20° C.

The size of a storage capacitor provided in the liquid crystal display device is set in consideration of the leakage current of the transistor provided in the pixel portion or the like so that a charge can be held for a predetermined period. By using a transistor including a high-purity oxide semiconductor layer, it is enough to provide a storage capacitor having a capacitance that is less than or equal to ⅓, preferably less than or equal to ⅕ of a liquid crystal capacitance of each pixel.

In the transistor including an oxide semiconductor layer used in this embodiment, the current in an off state (the off-state current) can be made small. Therefore, an electrical signal such as an image signal can be held for a long period, and a writing interval can be set long when the power is on. Accordingly, frequency of refresh operation can be reduced, which leads to an effect of suppressing power consumption.

The field-effect mobility of the transistor including an oxide semiconductor layer used in this embodiment can be relatively high, whereby high-speed operation is possible. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an advanced super view (ASV) mode, and the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. An embodiment of the present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, so that current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material thereof.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The display device performs display by transmitting light from a light source or a display element. Therefore, the substrate and the thin films such as the insulating layer and the conductive layer provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

As described above, by using any of the transistors exemplified in Embodiment 1, Embodiment 2 or Embodiment 3, the highly reliable semiconductor device can be provided. Note that the transistors described in Embodiment 1, Embodiment 2 or Embodiment 3 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

The structures, methods, and the like described in this embodiment can be combined as appropriate with any of the structures, methods, and the like described in the other embodiments.

Embodiment 5

A semiconductor device that is one embodiment of the present invention can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, and a large-sized game machine such as a pachinko machine. Examples of electronic appliances each including the semiconductor device described in the above embodiment will be described.

Figure 8A:
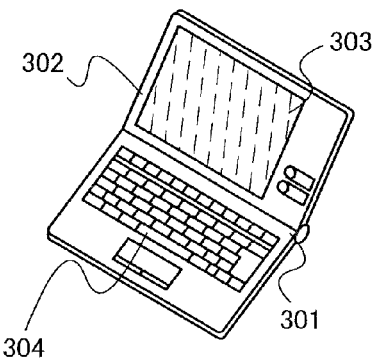
FIGS. 8A to 8F each illustrate an electronic appliance as a semiconductor device.

FIG. 8A illustrates a laptop personal computer which includes a main body 301, a housing 302, a display portion 303, a keyboard 304, and the like. The semiconductor device described in any of Embodiments 1 to 4 is used, whereby a highly reliable laptop personal computer can be provided.

Figure 8B:
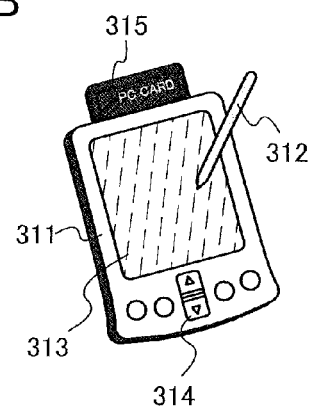

FIG. 8B illustrates a personal digital assistant (PDA) which includes a main body 311 provided with a display portion 313, an external interface 315, an operation button 314, and the like. A stylus 312 is included as an accessory for operation. The semiconductor device described in any of Embodiments 1 to 4 is used, whereby the highly reliable personal digital assistant (PDA) can be provided.

Figure 8C:
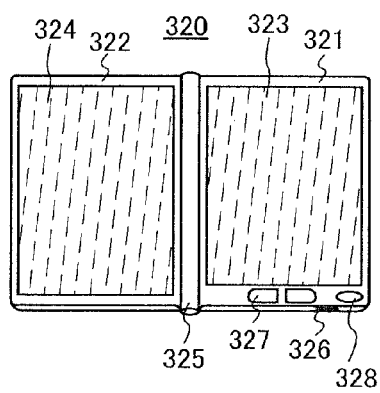

FIG. 8C illustrates an example of an e-book reader. For example, an e-book reader 320 includes two housings, a housing 321 and a housing 322. The housing 321 and the housing 322 are combined with a hinge 325 so that the e-book reader 320 can be opened and closed with the hinge 325 as an axis. With such a structure, the e-book reader 320 can operate like a paper book.

A display portion 323 and a display portion 324 are incorporated in the housing 321 and the housing 322, respectively. The display portion 323 and the display portion 324 may display one image or different images. When the display portion 323 and the display portion 324 display different images, for example, text can be displayed on a display portion on the right side (the display portion 323 in FIG. 8C) and graphics can be displayed on a display portion on the left side (the display portion 324 in FIG. 8C). The semiconductor device described in any of Embodiments 1 to 4 is used, whereby the highly reliable e-book reader can be provided.

FIG. 8C illustrates an example in which the housing 321 is provided with an operation portion and the like. For example, the housing 321 is provided with a power switch 326, operation keys 327, a speaker 328, and the like. With the operation keys 327, pages can be turned. Note that a keyboard, a pointing device, or the like may also be provided on a surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader 320 may have a function of an electronic dictionary.

The e-book reader 320 may send and receive data wirelessly. Through wireless communication, desired book data or the like can be purchased and downloaded from an electronic book server.

Figure 8D:
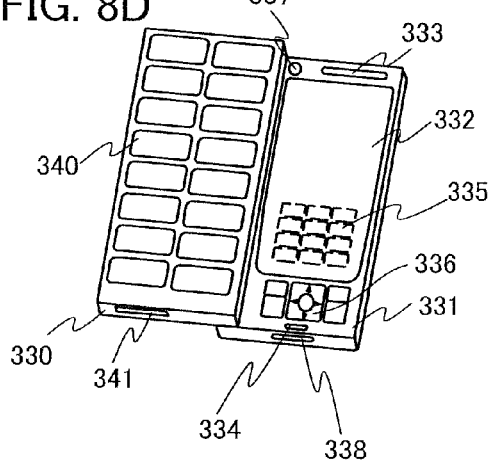

FIG. 8D illustrates a portable information terminal, which includes two housings, a housing 330 and a housing 331. The housing 331 includes a display panel 332, a speaker 333, a microphone 334, a pointing device 336, a camera lens 337, an external connection terminal 338, and the like. In addition, the housing 330 includes a solar cell 340 having a function of charge of the portable information terminal, an external memory slot 341, and the like. Further, an antenna is incorporated in the housing 331. The semiconductor device described in any of Embodiments 1 to 4 is used, whereby the highly reliable portable information terminal can be provided.

Further, the display panel 332 is provided with a touch panel. A plurality of operation keys 335 which are displayed as images is illustrated by dashed lines in FIG. 8D. Note that the mobile phone includes a boosting circuit for raising a voltage output from the solar cell 340 to a voltage necessary for each circuit.

In the display panel 332, the display direction can be changed as appropriate depending on a usage pattern. Further, the mobile phone is provided with the camera lens 337 on the same surface as the display panel 332, and thus it can be used as a video phone. The speaker 333 and the microphone 334 can be used for videophone calls, recording and playing sound, and the like as well as voice calls. Moreover, the housings 330 and 331 in a state where they are opened as illustrated in FIG. 8D can be slid so that one overlaps the other; therefore, the size of the mobile phone can be reduced, which makes the mobile phone suitable for being carried.

The external connection terminal 338 can be connected to an AC adapter and various types of cables such as a USB cable, and charging and data communication with a personal computer are possible. Moreover, a larger amount of data can be stored by inserting a recording medium to the external memory slot 341 and can be moved.

Further, in addition to the above functions, an infrared communication function, a television reception function, or the like may be provided.

Figure 8E:
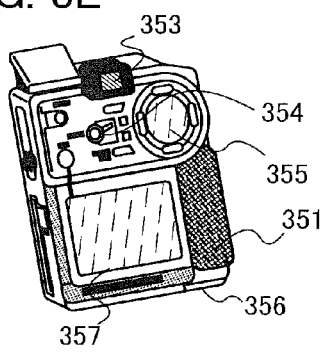

FIG. 8E illustrates a digital video camera, which includes a main body 351, a display portion A 357, an eyepiece 353, an operation switch 354, a display portion B 355, a battery 356, and the like. The semiconductor device described in any of Embodiments 1 to 4 is used, whereby the highly reliable digital video camera can be provided.

Figure 8F:
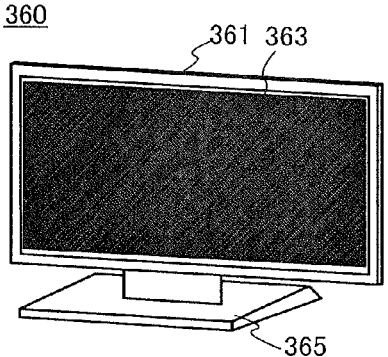

FIG. 8F illustrates an example of a television set. In a television set 360, a display portion 363 is incorporated in a housing 361. The display portion 363 can display images. Here, the housing 361 is supported by a stand 365. The semiconductor device described in any of Embodiments 1 to 4 is used, whereby the highly reliable television set 360 can be provided.

The television set 360 can be operated by an operation switch of the housing 361 or a separate remote controller. Further, the remote controller may be provided with a display portion for displaying data output from the remote controller.

Note that the television set 360 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

The structures, methods, and the like described in this embodiment can be combined as appropriate with any of the structures, methods, and the like described in the other embodiments.

This application is based on Japanese Patent Application serial no. 2010-167383 filed with Japan Patent Office on Jul. 26, 2010, the entire contents of which are hereby incorporated by reference.

What is claimed is:

1. A method for manufacturing a semiconductor device, comprising the steps of:
    forming an insulating layer including a first region and a second region;
    forming an oxide semiconductor layer in contact with the first region and the second region;
    performing a heat treatment on the oxide semiconductor layer so that an oxygen density of a part of the oxide semiconductor layer in contact with the first region is reduced;
    forming a gate insulating layer in contact with the oxide semiconductor layer; and
    forming a gate electrode in contact with the gate insulating layer;
    wherein a composition of the first region is different from a composition of the second region, and
    wherein a channel region in the oxide semiconductor layer overlaps with the first region.

2. The method for manufacturing a semiconductor device according to claim 1,
    wherein the first region comprises silicon oxide, and
    wherein the second region comprises silicon oxide, silicon nitride, silicon nitride oxide, silicon oxynitride, aluminum oxide, aluminum nitride, or aluminum oxynitride.

3. The method for manufacturing a semiconductor device according to claim 1, wherein the first region is formed by a sputtering method.

4. The method for manufacturing a semiconductor device according to claim 1, wherein a surface of the first region and a surface of the second region are coplanar with each other.

5. The method for manufacturing a semiconductor device according to claim 1, wherein the oxide semiconductor layer is formed by a sputtering method.

6. The method for manufacturing a semiconductor device according to claim 1, wherein the heat treatment is performed at a temperature higher than or equal to 100° C. and lower than or equal to 650° C.

7. The method for manufacturing a semiconductor device according to claim 1, wherein a source region and a drain region are formed in the part of the oxide semiconductor layer with the use of the gate electrode as a mask.

8. The method for manufacturing a semiconductor device according to claim 7, wherein an amount of oxide deficiency in the channel region is lower than in the source region and the drain region.

9. The method for manufacturing a semiconductor device according to claim 1, further comprising the steps of:
    forming an interlayer insulating layer over the gate electrode, and
    forming a wiring over the interlayer insulating layer and in contact with the oxide semiconductor layer through an opening provided in the interlayer insulating layer.

10. The method for manufacturing a semiconductor device according to claim 1,
    wherein the first region comprises silicon oxide in which the number of oxygen atoms is more than twice the number of silicon atoms per unit volume, and
    wherein the second region comprises silicon oxide or silicon oxynitride in which the number of oxygen atoms per unit volume is smaller than the number of oxygen atoms per unit volume of the first region.

11. The method for manufacturing a semiconductor device according to claim 1, wherein oxygen is released from the insulating layer and the gate insulating layer by the heat treatment.

12. The method for manufacturing a semiconductor device according to claim 1, wherein the insulating layer and the gate insulating layer comprise silicon oxide in which the number of oxygen atoms is more than twice the number of silicon atoms per unit volume.

13. The method for manufacturing a semiconductor device according to claim 1, wherein the first region contains oxygen at a higher concentration than the second region.

14. A method for manufacturing a semiconductor device, comprising the steps of:
    forming a first insulating layer;
    forming a second insulating layer over and in contact with the first insulating layer;
    forming an oxide semiconductor layer over and in contact with the first insulating layer and the second insulating layer;
    performing a heat treatment on the oxide semiconductor layer so that an oxygen density of a part of the oxide semiconductor layer in contact with the second insulating layer is reduced;
    forming a gate insulating layer over and in contact with the oxide semiconductor layer; and
    forming a gate electrode over the gate insulating layer,
    wherein a composition of the first insulating layer is different from a composition of the second insulating layer, and
    wherein a channel region in the oxide semiconductor layer overlaps with the second insulating layer.

15. The method for manufacturing a semiconductor device according to claim 14, wherein the second insulating layer comprises silicon oxide.

16. The method for manufacturing a semiconductor device according to claim 14, wherein the second insulating layer is formed by a sputtering method using oxygen or a mixed gas of oxygen and argon.

17. The method for manufacturing a semiconductor device according to claim 14, wherein the oxide semiconductor layer is formed by a sputtering method.

18. The method for manufacturing a semiconductor device according to claim 14, wherein the heat treatment is performed at a temperature higher than or equal to 100° C. and lower than or equal to 650° C.

19. The method for manufacturing a semiconductor device according to claim 14, wherein a source region and a drain region are formed in the part of the oxide semiconductor layer with the use of the gate electrode as a mask.

20. The method for manufacturing a semiconductor device according to claim 19, wherein an amount of oxide deficiency in the channel region is lower than in the source region and the drain region.

21. The method for manufacturing a semiconductor device according to claim 14, further comprising the steps of:

forming an interlayer insulating layer over the gate electrode, and forming a wiring over the interlayer insulating layer and in contact with the oxide semiconductor layer through an opening provided in the interlayer insulating layer.

22. The method for manufacturing a semiconductor device according to claim 14, wherein oxygen is released from the second insulating layer and the gate insulating layer by the heat treatment.

23. The method for manufacturing a semiconductor device according to claim 14, wherein the second insulating layer and the gate insulating layer comprise silicon oxide in which the number of oxygen atoms is more than twice the number of silicon atoms per unit volume.

* * * * *